(12) United States Patent
Brink et al.

(10) Patent No.: US 10,256,392 B1
(45) Date of Patent: Apr. 9, 2019

(54) VERTICAL TRANSMON QUBIT DEVICE

(71) Applicant: International Business Machines Corporation, Armonk, NY (US)

(72) Inventors: Markus Brink, White Plains, NY (US); Sami Rosenblatt, White Plains, NY (US); Rasit Onur Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/934,375

(22) Filed: Mar. 23, 2018

(51) Int. Cl.
| H01L 29/06 | (2006.01) |
| H01L 39/24 | (2006.01) |
| G06N 99/00 | (2019.01) |
| H01L 39/22 | (2006.01) |
| H01L 39/02 | (2006.01) |
| H01L 27/18 | (2006.01) |

(52) U.S. Cl.
CPC ....... *H01L 39/2493* (2013.01); *G06N 99/002* (2013.01); *H01L 27/18* (2013.01); *H01L 39/025* (2013.01); *H01L 39/223* (2013.01)

(58) Field of Classification Search
CPC combination set(s) only.
See application file for complete search history.

(56) References Cited

U.S. PATENT DOCUMENTS

| 5,366,953 A | 11/1994 | Char et al. |
| 5,910,662 A | 6/1999 | Itozaki et al. |
| 6,348,699 B1 | 2/2002 | Zehe |
| 6,734,454 B2 | 5/2004 | Van Duzer et al. |
| 6,818,549 B2 | 11/2004 | Fricke et al. |

(Continued)

FOREIGN PATENT DOCUMENTS

WO 2017015432 1/2017

OTHER PUBLICATIONS

Braumuller et al., "Concentric transmon qubit featuring fast tunability and an anisotropic magnetic dipole moment," arXiv:1509.08014v3 [quant-ph], Jan. 2016, 10 pages.
Mariantoni et al., "Two-resonator circuit quantum electrodynamics: A superconducting quantum switch," Physical Review B, 78, 2008, 22 pages.

(Continued)

*Primary Examiner* — Selim U Ahmed
*Assistant Examiner* — Andre Stevenson
(74) *Attorney, Agent, or Firm* — Amin, Turocy & Watson, LLP

(57) ABSTRACT

Techniques for a vertical transmon qubit device are provided. In one embodiment, a chip surface base device structure is provided that comprises a first superconducting material physically coupled to a crystalline substrate, wherein the crystalline substrate is physically coupled to a second superconducting material, wherein the second superconducting material is physically coupled to a second crystalline substrate. In one implementation, the chip surface base device structure also comprises a vertical Josephson junction located in a via of the crystalline substrate, the vertical Josephson junction comprising the first superconducting material, a tunnel barrier, and the second superconducting material. In one implementation, the chip surface base device structure also comprises a transmon qubit comprising the vertical Josephson junction and a capacitor formed between the first superconducting material and the second superconducting material.

25 Claims, 21 Drawing Sheets

(56) References Cited

U.S. PATENT DOCUMENTS

| | | | |
|---|---|---|---|
| 6,979,836 | B2 | 12/2005 | Zagoskin et al. |
| 7,888,746 | B2 | 2/2011 | Tischler |
| 8,148,715 | B2 | 4/2012 | Hollenberg et al. |
| 9,397,283 | B2 | 7/2016 | Abraham et al. |
| 9,425,377 | B2 | 8/2016 | Moyerman et al. |
| 9,501,748 | B2 | 11/2016 | Naaman et al. |
| 9,520,547 | B2 | 12/2016 | Abraham et al. |
| 9,741,918 | B2 | 8/2017 | Yohannes et al. |
| 9,768,371 | B2 | 9/2017 | Ladizinsky et al. |
| 2001/0035524 | A1 | 11/2001 | Zehe |
| 2004/0104449 | A1 | 6/2004 | Yoon et al. |
| 2008/0032501 | A1 | 2/2008 | Klein et al. |
| 2015/0357550 | A1 | 12/2015 | Schoelkopf, III et al. |
| 2016/0104073 | A1 | 4/2016 | Sandberg et al. |
| 2017/0133336 | A1 | 5/2017 | Oliver et al. |
| 2017/0133576 | A1 | 5/2017 | Marcus et al. |
| 2017/0148972 | A1 | 5/2017 | Thompson et al. |
| 2017/0179193 | A1 | 6/2017 | Tolpygo |
| 2017/0186935 | A1 | 6/2017 | Bonetti et al. |
| 2018/0040800 | A1* | 2/2018 | Chang .................. H01L 39/2493 |
| 2018/0232654 | A1* | 8/2018 | Epstein ................. G06N 99/002 |
| 2018/0287041 | A1* | 10/2018 | Abdo ................... H01L 39/2493 |

OTHER PUBLICATIONS

Defeo et al., "Microstrip Superconducting Quantum Interference Devices for Quantum Information Science," Doctoral dissertation, Syracuse University, 2012, 183 pages.

Mantl, "Compound formation by ion beam synthesis and a comparison with alternative methods such as deposition and growth or wafer bonding," Nuclear Instruments and Methods in Physics Research B 106, 1995, 9 pages.

Schoelkopf et al., "Final Report: Materials Limits on Coherence in Charge Qubits," IARPA CSQ project at Yale University, Jun. 2, 2015, 26 pages.

Koch et al., "Charge-insensitive qubit design derived from the Cooper pair box," Physical Review A, 76(4), 2007, 19 pages.

Grimm et al., "A self-aligned nano-fabrication process for vertical NbN—MgO—NbN Josephson junctions," arXiv:1705.05608v1 [cond-mat.mes-hall], May 16, 2017, 5 pages.

Lomatch et al., "Multilayered Josephson junction logic and memory devices," Proceedings of the SPIE—The International Society for Optical Engineering, vol. 2157, Jan. 1994, p. 332-343, 13 pages.

Island et al., "Thickness dependent interlayer transport in vertical MoS2 Josephson junctions," arXiv:1604.06944v2 [cond-mat.mes-hall] Jul. 1, 2016, 18 pages.

Notice of Allowance for U.S. Appl. No. 15/934,400 dated Oct. 31, 2018, 21 pages.

\* cited by examiner

VERTICAL TRANSMON QUBIT DEVICE

BACKGROUND

The subject disclosure relates to superconducting devices, and more specifically, to fabricating a vertical transmon qubit device using a silicon-on-metal (SOM) substrate.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Quantum computing hardware can be different from classical computing hardware. In particular, superconducting quantum circuits generally rely on Josephson junctions, which can be fabricated in a semiconductor device. A Josephson junction generally manifests the Josephson effect of a supercurrent, where current can flow indefinitely across a Josephson junction without an applied voltage. A Josephson junction can be created by weakly coupling two superconductors (a material that conducts electricity without resistance), for example, by a tunnel barrier.

One way in which a Josephson junction can be used in quantum computing is by embedding the Josephson junction in a superconducting circuit to form a quantum bit (qubit). A Josephson junction can be used to form a qubit by arranging the Josephson junction in parallel with a shunting capacitor. This arrangement of a Josephson junction in parallel with a shunting capacitor is sometimes referred to as a transmon (which is a shortened version of the phrase transmission line shunted plasma oscillation qubit) in the case where the shunting capacitor has a large capacitance such that the typical ratio of the Josephson energy to the charging energy in the qubit is larger than 10. While in some scenarios, where the ratio of Josephson energy to charging energy in the qubit has a smaller ratio may not be referred to as a transmon, herein, a transmon can designate any arrangement of a Josephson junction in parallel with a shunting capacitor. Other superconducting qubits exist that are not transmon qubits.

A transmon generally has a reduced sensitivity to charge noise compared to some other types of qubits. A mechanism by which a transmon can reduce sensitivity to charge noise is by increasing a ratio of Josephson energy to charging energy.

A problem with some prior art transmon qubits is that they occupy a relatively large amount of space. Specifically, a planar capacitor used in some transmon qubits occupies a large area. The compactness of such transmon qubits is limited by both surface and dielectric loss.

Then, there are also problems with some types of prior art Josephson junctions, as applied to producing transmons from these Josephson junctions. A type of Josephson junction with both low loss and low critical current can be made from shadow evaporated aluminum, aluminum oxide, and aluminum (Al—AlOx—Al). However, a problem with such a Josephson junction is that, once the Josephson junction is formed, the resulting device is subject to a low-temperature and process constraint.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, chip surface base device structures, computer-implemented methods, apparatus and/or computer program products that facilitate vertical transmon qubit devices are described.

According to an embodiment, a chip surface base device structure is provided. In one example, the chip surface base device structure comprises a first superconducting material physically coupled to a crystalline substrate, wherein the crystalline substrate is physically coupled to a second superconducting material, and wherein the second superconducting material is physically coupled to a second crystalline substrate. In one or more implementations, the chip surface base device structure can further comprise a vertical Josephson junction located in a via of the crystalline substrate, the vertical Josephson junction comprising the first superconducting material, a tunnel barrier, and the second superconducting material. In one or more implementations, the chip surface base device structure can also comprise a transmon qubit comprising the vertical Josephson junction and a capacitor formed between the first superconducting material and the second superconducting material.

In some examples, the chip surface base device structure further comprises an information transfer circuit in the second superconducting material that is communicatively coupled to the transmon qubit. An advantage of such a chip surface base device structure is that the transmon qubit and the information transfer circuit can be isolated from each other (other than intentional coupling for the purpose of computing), so that quantum information is not inadvertently leaked from the transmon qubit.

In another embodiment, a method is provided. In one example, the method comprises physically coupling a first superconducting material to a crystalline substrate. The method can further comprise physically coupling the crystalline substrate to a second superconducting material, wherein the second superconducting material is physically coupled to a second crystalline substrate. The method can further comprise forming a vertical Josephson junction in a via of the crystalline substrate, the vertical Josephson junction comprising the first superconducting material, a tunnel barrier, and the second superconducting material. The method can further comprise forming a transmon qubit comprising the vertical Josephson junction and a capacitor formed between the first superconducting material and the second superconducting material. An advantage of such a method can be that it can be used to fabricate transmon qubits that have improved scaling due to a reduced shunting capacitor footprint as compared to other types of capacitors.

In some examples, the method can further comprise removing a portion of the crystalline substrate, such that an edge of the crystalline substrate is located within an edge of the second superconducting material. An advantage of such a method can be that such a narrowed superconducting material reduces coupling to an external circuit.

In another embodiment, a chip surface base device structure is provided. In one example, the chip surface base device structure a vertical Josephson junction that is formed in a via of a crystalline substrate, the vertical Josephson junction comprising a first superconducting material physically coupled to a tunnel barrier, the tunnel barrier being physically coupled to a second superconducting material. In one or more implementations, the chip surface base device structure can further comprise a transmon qubit comprising the vertical Josephson junction and a capacitor formed between the first superconducting material and the second superconducting material. An advantage of such a chip surface base device structure can be that it provides for scaling due to a reduced capacitor footprint as compared to other types of capacitors.

In some examples, the chip surface base device structure further comprises a second transmon qubit formed from the first superconducting material and the crystalline substrate that is isolated from cross talk from the transmon qubit. An advantage of such a chip surface base device structure is that the transmon qubit and the second transmon qubit are well controlled and that no unwanted quantum information transfer occurs between the two qubits. An advantage of such a chip surface base device structure is that the transmon qubit and the other superconducting qubit are well controlled and that no unwanted quantum information transfer occurs between the two qubits (i.e., the other superconducting qubit is isolated from cross talk from the transmon qubit).

In another embodiment, a method is provided. In one example, the method comprises forming a vertical Josephson junction in a via of a crystalline substrate, the vertical Josephson junction comprising a first superconducting material physically coupled to a tunnel barrier, the tunnel barrier being physically coupled to a second superconducting material. The method can further comprise forming a transmon qubit comprising the vertical Josephson junction and a capacitor formed between the first superconducting material and the second superconducting material. An advantage of such a method can be that it can be used to fabricate transmon qubits that have improved scaling due to a reduced capacitor footprint as compared to other types of capacitors.

In some examples, the method can further comprise covering a portion of the second superconducting material that is located outside of the vertical Josephson junction with the crystalline substrate. An advantage of such covering this portion of the second superconducting material with the substrate can be that this portion of the second superconducting material is protected from oxidation.

In another embodiment, a chip surface base device structure is provided. In one example, the chip surface base device structure comprises a vertical Josephson junction formed in a via of a silicon-on-metal (SOM) base, where the SOM is a superconductor. In one or more implementations, the chip surface base device structure can further comprise a transmon qubit comprising the vertical Josephson junction and a capacitor formed between a portion of the superconductor of the SOM and a second superconducting material. An advantage of such a chip surface base device structure can be that it provides for scaling due to a reduced capacitor footprint as compared to other types of capacitors.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with prior art transmon qubits, the present disclosure can be implemented to produce a solution to at least some of these problems in the form of a transmon qubit that comprises a vertical Josephson junction. As used herein, some embodiments that describe transmon qubits (or Josephson junctions) can refer to vertical transmon qubits (or vertical Josephson junctions). Such a vertical transmon qubit can have an advantage of having a straightforward integration into a circuit. Such a vertical transmon qubit can also have a reduced transmon decoherence as compared to some other vertical transmon qubits, thus improving qubit characteristics. Such a vertical transmon qubit can have an advantage of being embedded into a very low-loss environment. Such a vertical transmon qubit can have an advantage of enabling scaling due to a smaller capacitor footprint. The capacitor associated with the transmon may also be referred to as shunting capacitor, as it is in parallel with (i.e., shunting) the Josephson junction. Relative to a vertical transmon qubit created using a shadow evaporation process, such a vertical transmon qubit can have an advantage of an improved frequency variability.

Such a vertical transmon qubit can have an advantage of having an associated fabrication (or process) flow that is compatible with chip manufacturing approaches, thus enabling scaling of qubit junction fabrication. Such a vertical transmon qubit can have an advantage of confining electrical field distributions within the vertical transmon qubit, thus occupying a small volume while maintaining a uniform electric field distribution (i.e., no local field concentration) across an associated shunting capacitor. Such a vertical transmon qubit can have an advantage of providing for multiple approaches to capacitively couple a vertical transmon qubit to resonators.

Figure 1:
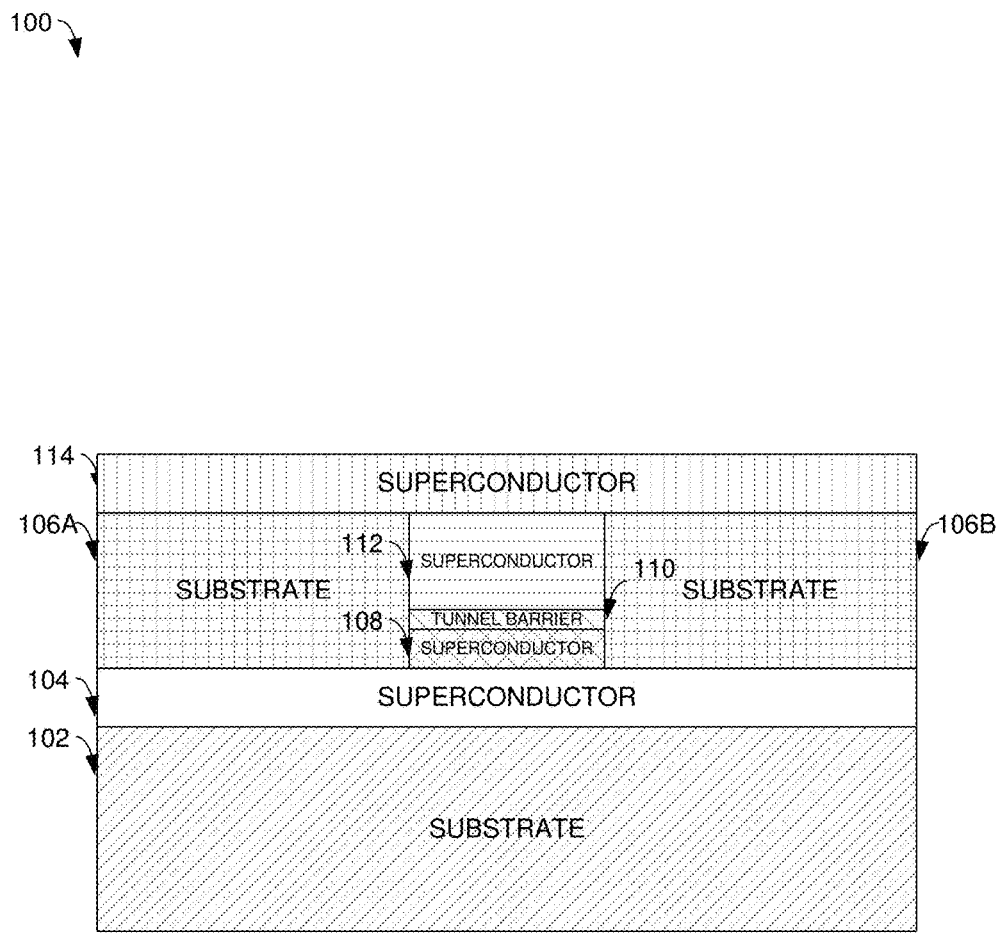
FIG. 1 illustrates an example, non-limiting chip surface base device structure comprising a vertical Josephson junction in accordance with one or more embodiments described herein.

FIG. 1 illustrates an example, non-limiting chip surface base device structure comprising a vertical Josephson junction in accordance with one or more embodiments described herein. Chip surface base device structure 100 comprises substrate 102, superconductor 104, substrate 106A, substrate 106B, superconductor 108, tunnel barrier 110, superconductor 112, and superconductor 114.

In some examples, substrate 102 and substrate 106 can have initial thicknesses of approximately 500 micrometers (μm) to 800 μm. Then, in some examples, the various materials used can be used in temperatures up to approximately 500 degrees Celsius (C). In some examples, materials with lower melting points, such as aluminum (Al) can be used, and these materials can begin to deform at approximately 300 C.

It can be appreciated that some like components of chip surface base device structure 100 touch each other—e.g., superconductor 104 and superconductor 108 are touching, and superconductor 112 and superconductor 114 are touching. It can be appreciated that this is a logical depiction. In some embodiments, these superconductors that are touching can be the same material, and can be deposited in one step. In other embodiments, these superconductors that are touching can be different (or still the same) materials, which were deposited in separate steps.

The vertical Josephson junction of chip surface base device structure 100 comprises tunnel barrier 110, with superconductor 108 (and optionally in combination with superconductor 104) serving as a first capacitive plate of the vertical Josephson junction, and superconductor 112 (and optionally in combination with superconductor 114) serving as a second capacitive plate of the vertical Josephson junction. In some examples, a thickness of the superconductor(s) of the first capacitive plate and a thickness of the superconductor(s) of the second capacitive plate are approximately the same. This thickness can be greater than 100 nm.

In examples where a same superconducting material is used for both the first capacitive plate and for the second capacitive plate, a superconducting gap on each side of the tunnel barrier can be equal, which may be utilized in determining a critical current of the vertical Josephson junction. A value for a critical current in a vertical Josephson junction can be based on materials used, thickness of the tunnel barrier 110, and surface areas of those materials in the junction. Creating multiple vertical Josephson junctions where the associated critical current is more reproducible between those vertical Josephson junctions can be based on material type(s) used, thickness of those materials, and a size of an opening of the vertical Josephson junction.

Another metric associated with a vertical Josephson junction can be a thickness of a material in a vertical Josephson junction where a magnetic field does not penetrate. Where Al is used as a material in a layer, such a thickness of that material may be 100-200 nm. Tungsten (W) can be another material used, and which has different properties than Al as applied to the penetration of magnetic fields.

The vertical Josephson junction can be formed in a via of a substrate layer, which comprises substrate 106A and substrate 106B, and can originally have contained substrate where superconductor 108, tunnel barrier 110, and superconductor 112 are located. A via can generally comprise an opening through a layer of a chip base surface, through which a conductive connection between two other layers can be formed. This via can be created through etching into the substrate. In some examples, etch lithography can be implemented to etch the via, with a depth of the via of 100-200 nm. In some examples, an aspect ratio of 1:1 between a height and a width of a via can be effectuated.

It can be appreciated that chip surface base device structure 100 presents one of several embodiments of a vertical Josephson junction that can be utilized in a vertical transmon qubit, according to the techniques of the present disclosure. For example, there can be an embodiment of a vertical Josephson junction that omits superconductor 108, so that tunnel barrier 110 is in contact with superconductor 104. For example, there can also be an embodiment of a vertical Josephson junction that omits superconductor 112 (with superconductor 108 being correspondingly thicker), where tunnel barrier sits at a "top" of the via—a placement in the via at an opposite end from superconductor 104.

In some examples, tunnel barrier 110 can be deposited on chip surface base device structure 100 using a sputter approach, an evaporative approach, an atomic layer deposition (ALD) approach, or chemical modification (e.g., oxidation) of superconductor 104 or superconductor 108. In some examples, tunnel barrier 110 can be aluminum oxide ($Al_2O_3$), a non-superconducting metal (sometimes referred to as a "normal" metal), an oxide or a nitride. In some examples, the tunnel barrier 110 can be formed by oxidation of the exposed surface (after etch) of superconductor 104 or superconductor 108. Generally, a tunnel barrier layer can be a thin layer of non-conducting material.

In chip surface base device structure 100, superconductor 104 and superconductor 108 (and superconductor 112 and superconductor 114) are touching, or next to, each other. In general, two superconductors that are placed next to each other in this arrangement or a similar arrangement behave as a single superconductor, and will exhibit a single superconducting phase even where the two superconductors are made up of different materials from each other.

Chip surface base device structure 100 can be considered to be a buried metal flow. In some examples, a portion of superconductor 104 is deposited onto substrate 102, and a portion of superconductor 104 is deposited onto substrate 106. Then, these two portions of superconductor 104 can be bonded together to connect substrate 102 to superconductor 104 to substrate 106. Put another way, after depositing the respective portions of superconductor 104 on substrate 102 and substrate 106, respectively, the exposed surface of the first part of superconductor 104 can then bonded to the exposed surface of the second part of superconductor 104. In some examples, bonding can be effectuated with a low-temperature anneal, or another adhesion approach. There are other terms in which the arrangement of chip surface base device structure can be referred to, such as silicon-on-metal (SOM).

Then, the top substrate layer—comprising substrate 106A and substrate 106B—can be ground to a thickness of approximately 100-200 nm, either before or after substrate 106, superconductor 104, and substrate 102 are bonded together. This thickness of 100-200 nm can be obtained by acquiring crystalline silicon wafers with that thickness (such as those grown by a manufacturer), or by acquiring crystalline silicon wafers with a thickness greater than 100-200 nm, and then—after coupling the substrate, the superconductor, and the second substrate—removing some of the crystalline silicon so that its thickness is then 100-200 nm.

In some examples, superconductor 104, as well as other superconductors as described herein, can be titanium (Ti), tantalum (Ta), titanium nitride (TiN). In other examples, superconductor 108, as well as some superconductors described herein can be niobium (Nb) or aluminum (Al). Considerations about the properties of certain materials, and their placement in a chip surface base device structure, such as an amount of thermal treatment involved at a layer of the chip surface base device structure, can affect choice of materials.

The cross-sectional side view of chip surface base device structure 100 shows that substrate 106A and substrate 106B are separated. However, it can be appreciated that a hole has been formed in this substrate layer, which is shown in this cross-sectional side view, and that substrate 106A and substrate 106B are still connected (e.g., from above, this substrate could look as if a hole was formed in the middle of it). Other materials in cross-sectional side views can be similarly attached though they appear to be separated in the cross-sectional side view.

In some examples, one or more of substrate 102, substrate 106A, and substrate 106B, as well as other substrates as described herein, can be crystalline silicon (Si). The use of crystalline Si can improve a coherence time of a qubit associated with a vertical Josephson junction as described herein. Additionally, in some examples, a high-resistivity crystalline Si can be utilized, which can further improve coherence time. In some examples, this crystalline Si can be grown.

In some examples, these various superconductors—i.e., superconductor 104, superconductor 108, superconductor 112, and superconductor 114—can comprise different types of materials from each other. In other examples, two or more of these various superconductors can be the same type of material. In an embodiment, superconductor 104 can be Ti, superconductor 108 can be Ta, and superconductor 112 can be Ta (the same as superconductor 108), and superconductor 114 can be TiN. In some examples, the superconductor 112 is deposited with a greater thickness than superconductor 104 and/or superconductor 108, and this increased thickness can facilitate a better control of removing part or all of superconductor 108 layer at a later time.

Figure 2:
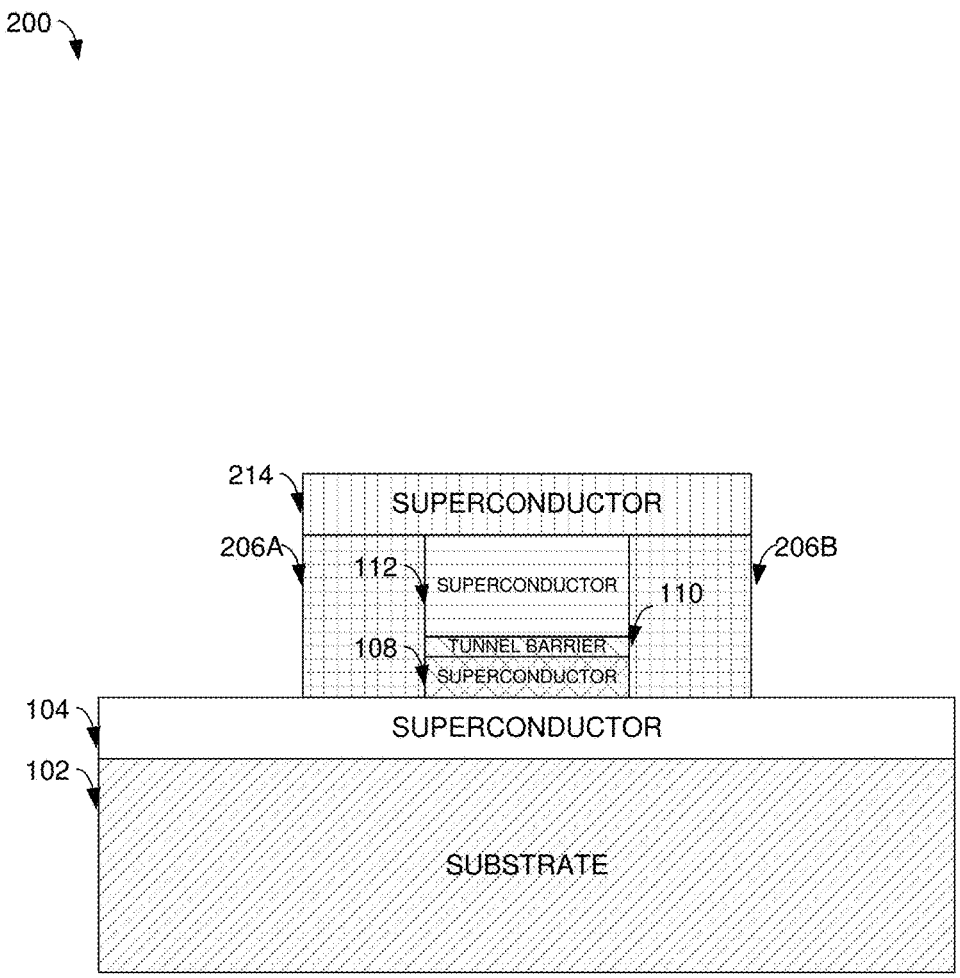
FIG. 2 illustrates the example, non-limiting chip surface base device structure of FIG. 1 after removing some material in accordance with one or more embodiments described herein.

FIG. 2 illustrates the example, non-limiting chip surface base device structure of FIG. 1 after removing some material in accordance with one or more embodiments described herein. Removing some material in this manner may be performed in the process of creating a vertical transmon qubit from the vertical Josephson junction of FIG. 1.

In FIG. 2, some of substrate 106A has been removed to produce substrate 206A. In chip surface base device structure 200, some of substrate 106B has been removed to produce substrate 206B. Some of superconductor 114 has been removed to produce superconductor 214, which can also be referred to as top plate. To effectuate removing material, as depicted in FIG. 2, and elsewhere, etching (such as etch lithography) can be used. In some examples, chip surface base device structure 200 is created from chip surface base device structure 100 using a mask and reactive ion etch (RIE) approach.

Figure 3:
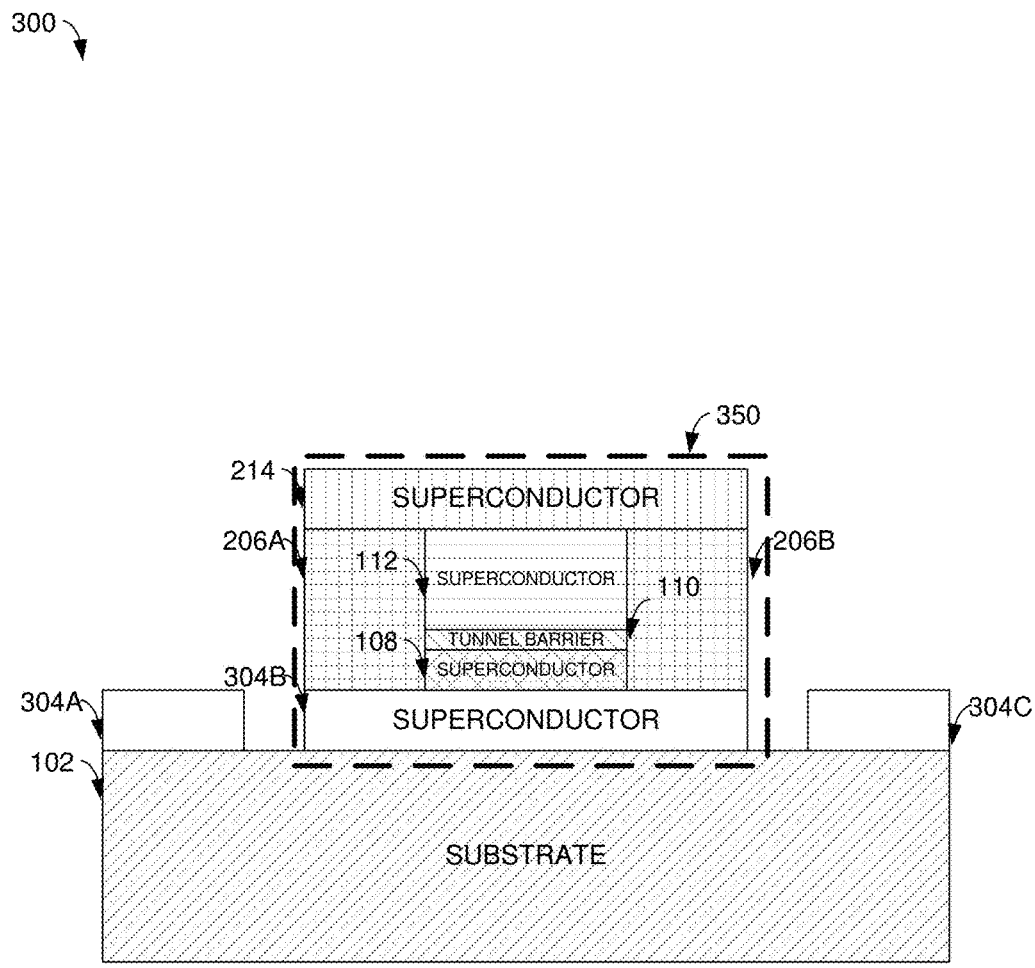
FIG. 3 illustrates the example, non-limiting chip surface base device structure of FIG. 2 after removing some material to form a vertical transmon qubit in accordance with one or more embodiments described herein.

FIG. 3 illustrates the example, non-limiting chip surface base device structure of FIG. 2 after removing some material to form a vertical transmon qubit 350 in accordance with one or more embodiments described herein. In chip surface base device structure 300, some of superconductor 104 has been removed to produce superconductor 304A, superconductor 304B, and superconductor 304C. Thus, chip surface base device structure 300 comprises a vertical transmon qubit, with superconductor 304B (also referred to as bottom plate), substrate 206A, substrate 206B, superconductor 108, tunnel barrier 110, superconductor 112, and superconductor 214. In some examples, chip surface base device structure 300 is created from chip surface base device structure 200 using a mask and RIE approach.

In an example, superconductor 214 can have a width of approximately 7.5 microns (μm); superconductor 112, tunnel barrier 110, and superconductor 108 can have a width of approximately 100 nanometers (nm); substrate 206A and substrate 206B can have a height of approximately 100 nm; and a space between superconductor 304A and superconductor 304B, and between superconductor 304B and superconductor 304C can be a distance of approximately 10 μm. Using these example dimensions, the transmon of chip surface base device structure 300 would have the following metrics: a capacitance C of approximately 60 femto farads (fF); a vertical Josephson junction height and width of approximately 100 nm each; a dielectric constant of Si ($\varepsilon_{Si}$) of approximately 11.7; and a lateral size of the transmon of approximately 7.5 μm.

Additionally, substrate 206A and substrate 206B can have a thickness of 50-300 nm, or 20-500 nm, with a corresponding vertical Josephson junction width. A capacitance here can be determined as capacitance=(dielectric constant*area/separation of plates)*dielectric permittivity of a vacuum. Dielectric permittivity of a vacuum is then $8.85*10^{-12}$ F/m. Then, for a given capacitance, a corresponding separation of plates or plate area can be determined. This estimate relies on assuming that the capacitance of the transmon is dominated by the shunting capacitor plates and not by the parasitic capacitance to ground or the intrinsic capacitance of the vertical Josephson junction.

These dimensions and metrics present an advantage relative typical transmons, because the transmon here is smaller. In contrast to this smaller transmon, a typical transmon can have a lateral size of 700 μm, which is nearly two orders of magnitude larger than the lateral size of the transmon here.

Figure 4:
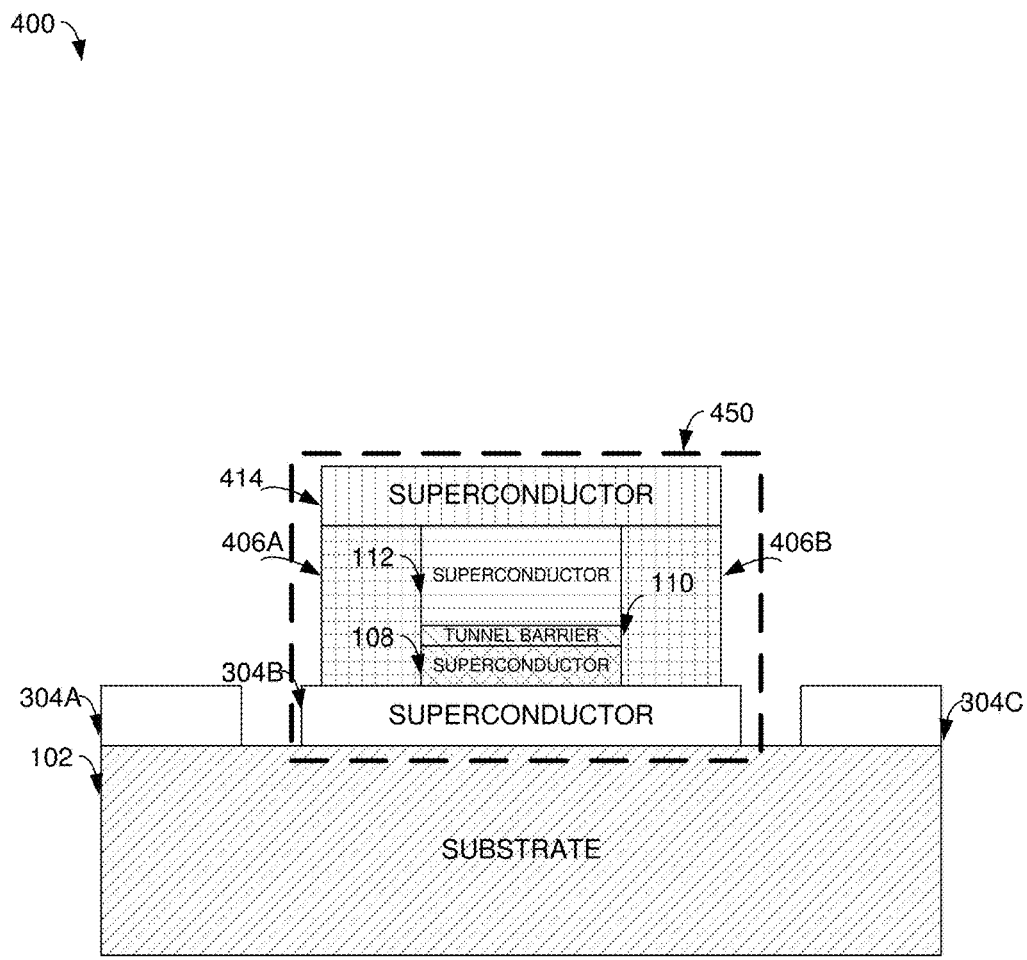
FIG. 4 illustrates the example, non-limiting chip surface base device structure of FIG. 2 after removing some material to form another vertical transmon qubit in accordance with one or more embodiments described herein.

FIG. 4 illustrates the example, non-limiting chip surface base device structure of FIG. 2 after removing some material to form another vertical transmon qubit 450 in accordance with one or more embodiments described herein. A difference between chip surface base device structure 300 and chip surface base device structure 400 is that, in chip surface base device structure 400, some material of the top superconductor layer (superconductor 414, also referred to as top plate) and the top substrate layer (substrate 406A and substrate 406B) has been removed relative to superconductor 304B, so that edges of superconductor 304B extend out past corresponding edges of substrate 406A, substrate 406B, and superconductor 414.

In some examples, superconductor 304B can have a one-sided coupling, and in some examples, superconductor 304B can have a multi-sided coupling. As depicted, a vertical Josephson junction of chip surface base device structure 400 can have a height of approximately 100-200 nm, and then an associated bottom plate (superconductor 304B) to resonator space can be in the range of several microns. The top plate of the vertical Josephson junction (superconductor 414) can be narrowed down relative to a corresponding top plate in chip surface base device structure 300 in order to reduce its coupling to an external circuit.

Figure 5:
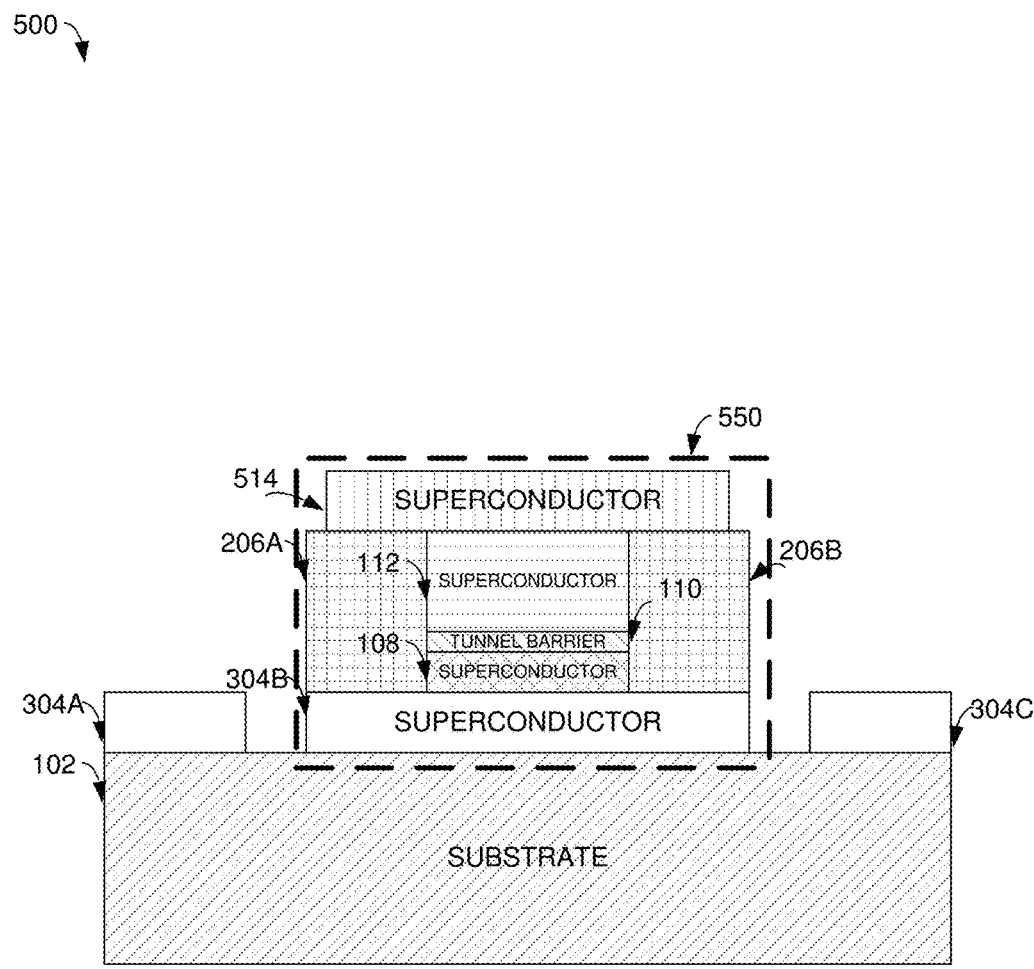
FIG. 5 illustrates the example, non-limiting chip surface base device structure of FIG. 3 after removing some material to form another vertical transmon qubit in accordance with one or more embodiments described herein.

FIG. 5 illustrates the example, non-limiting chip surface base device structure of FIG. 3 after removing some material to form another vertical transmon qubit 550 in accordance with one or more embodiments described herein. A difference between chip surface base device structure 300 and chip surface base device structure 500 is that, in chip surface base device structure 500, some material of the top superconductor layer (superconductor 514, also referred to as top plate) has been removed relative to superconductor 304B, substrate 206A, and substrate 206B, so that edges of superconductor 304B, substrate 206A, and substrate 206B extend out past corresponding edges of superconductor 514.

Figure 6:
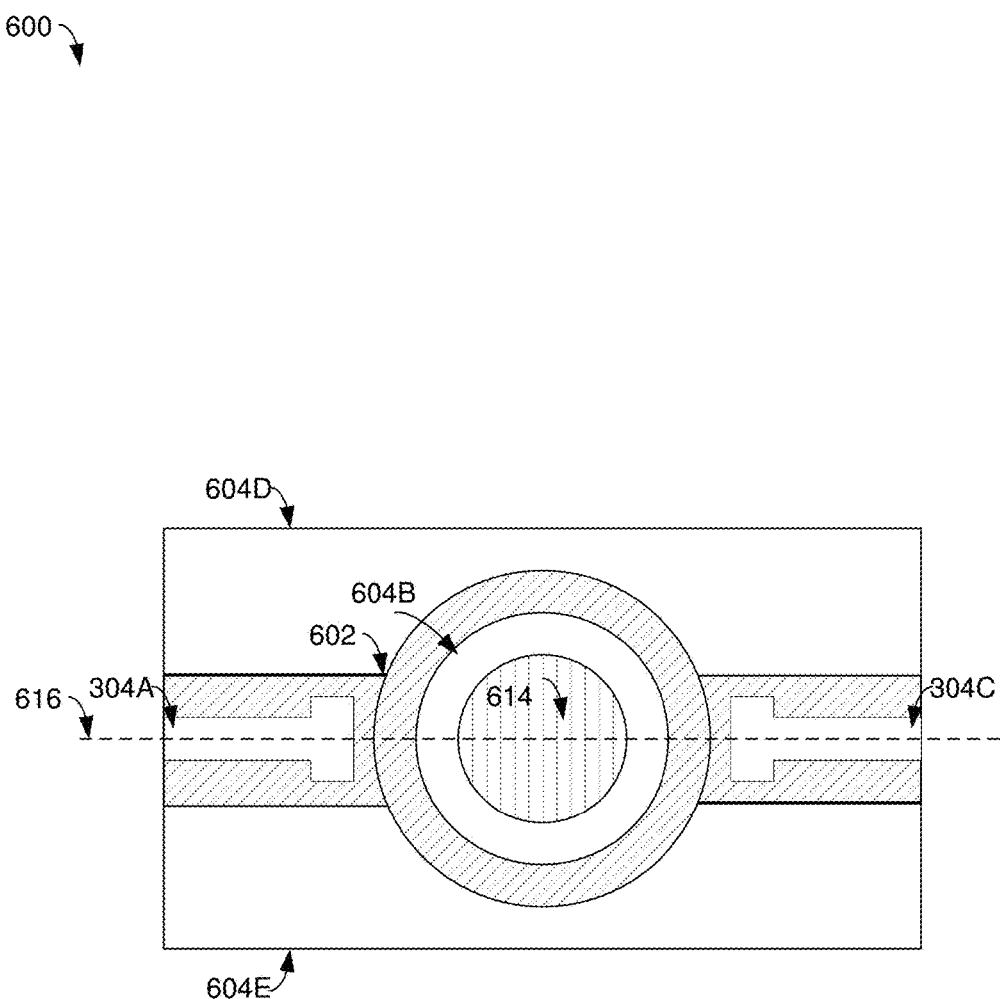
FIG. 6 illustrates a top view of the example, non-limiting chip surface base device structure of FIG. 4 in accordance with one or more embodiments described herein.

FIG. 6 illustrates a top view of the example, non-limiting chip surface base device structure of FIG. 4 in accordance with one or more embodiments described herein. Dashed line 616 indicates where the cross-sectional side view of chip surface base device structure 400 occurs relative to chip surface base device structure 600. Whereas chip surface base device structure 400 illustrates a side view of a chip surface base device structure, chip surface base device structure 600 illustrates a corresponding top view of this chip surface base device structure. With chip surface base device structure 600, the vertical transmon qubit is formed into a circular shape (in contrast to the rectangular shape of the vertical transmon qubit of chip surface base device structure 700).

Chip surface base device structure 600 features circular capacitor pad shapes. Superconductor 604B comprises superconductor 304B, in an embodiment where superconductor 304B is formed into a circular shape. Superconductor 614 comprises superconductor 414 in an embodiment where superconductor 414 is configured in a circular shape. Similarly, substrate 602 comprises substrate 102 in an embodiment where substrate 102 is exposed in this top-down view of chip surface base device structure 600 with a substantially circular shape (though there is a portion of substrate 602 that is not exposed in this view, and substrate 602 can extend throughout chip surface base device structure 600).

In chip surface base device structure 600, superconductor 304A and superconductor 304C can serve as couplers to external circuits. Additionally, multiple qubits can be connected through the same circuit.

While circular shapes and rectangular (or square) shapes are described herein, it can be appreciated that suitable shapes can be substantially circular, substantially elliptical, substantially rectangular, or substantially square, and that there can be other embodiments that utilize other shapes.

Superconductor 604D and superconductor 604E include some superconductor that is not seen when considering the cross-sectional view of FIG. 4.

In FIG. 6 (and in similar FIGS. that depict a top view), superconductor 304A and superconductor 304C function as microwave interconnects, or resonators (sometimes also referred to as microwave resonators, or resonant buses). That is, inasmuch as superconductor 304A, superconductor 304B, and superconductor 304C can be considered to be a bottom superconductor layer of a chip surface base device structure, this bottom superconductor layer can be utilized to communicatively access a vertical transmon qubit. In various examples, a vertical transmon qubit comprises a vertical Josephson junction and two capacitor pads (sometimes referred to as a top capacitor pad and a bottom capacitor pad, respectively), and a communicative coupling can also be made using either of these two capacitor pads.

A coupling between a resonator and a qubit is affected by placing a capacitor between the resonator and the qubit. A resonator can provide for measuring a transmon, controlling a transmon, coupling to a transmon, and/or coupling transmons to other transmons.

Figure 7:
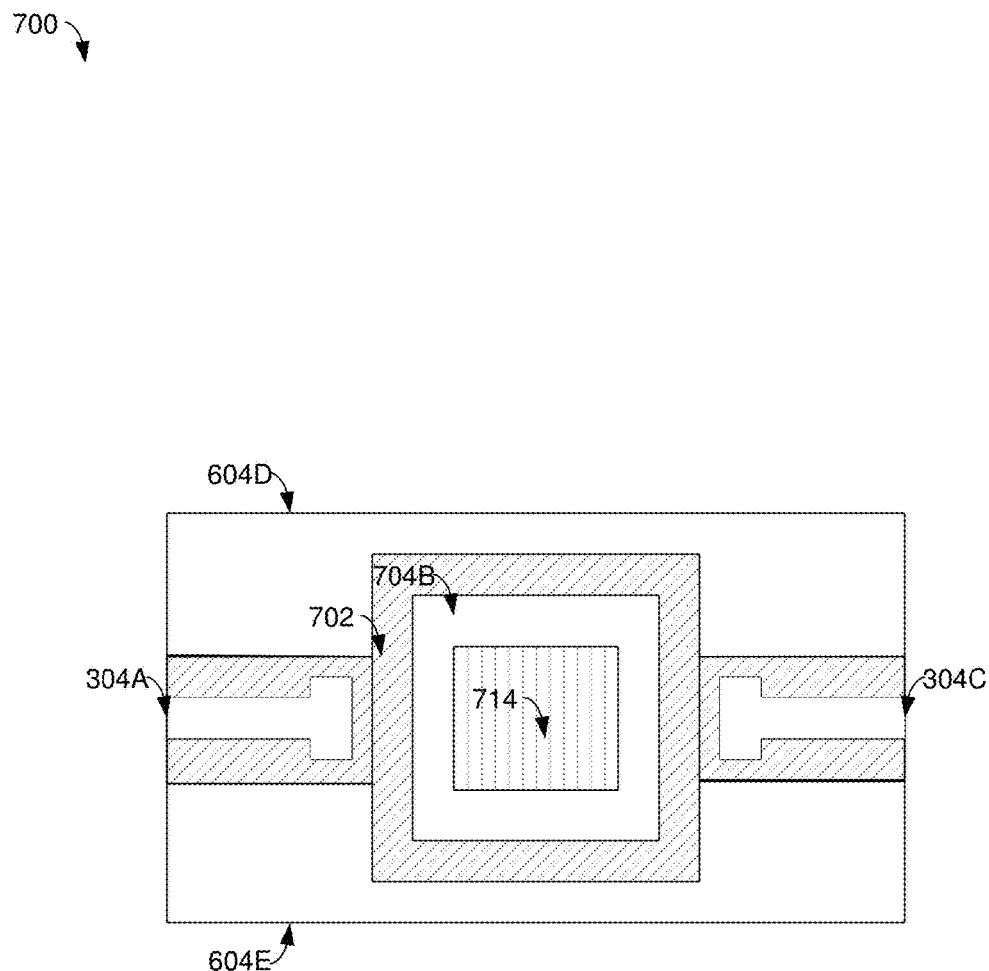
FIG. 7 illustrates another top view of the example, non-limiting chip surface base device structure of FIG. 4 in accordance with one or more embodiments described herein.

FIG. 7 illustrates another top view of the example, non-limiting chip surface base device structure of FIG. 4 in accordance with one or more embodiments described herein. Whereas chip surface base device structure 400 illustrates a side view of a chip surface base device structure, chip surface base device structure 700 illustrates a corresponding top view of this chip surface base device structure. With chip surface base device structure 700, the vertical transmon qubit is formed into a rectangular shape (in contrast to the circular shape of the vertical transmon qubit of chip surface base device structure 700).

Chip surface base device structure 700 features rectangular capacitor pad shapes. Superconductor 704B comprises superconductor 304B, in an embodiment where superconductor 304B is formed into a rectangular (or square) shape. Superconductor 714 comprises superconductor 414 in an embodiment where superconductor 414 is configured in a rectangular shape. Similarly, substrate 702 comprises substrate 102 in an embodiment where substrate 102 is exposed in this top down view of chip surface base device structure 700 with a substantially rectangular shape (though there is a portion of substrate 702 that is not exposed in this view, and substrate 702 can extend throughout chip surface base device structure 700).

Given this configuration, chip surface base device structure 700 can be considered to have an etched island layout. There are other terms in which the arrangement of chip surface base device structure can be referred to.

Figure 8:
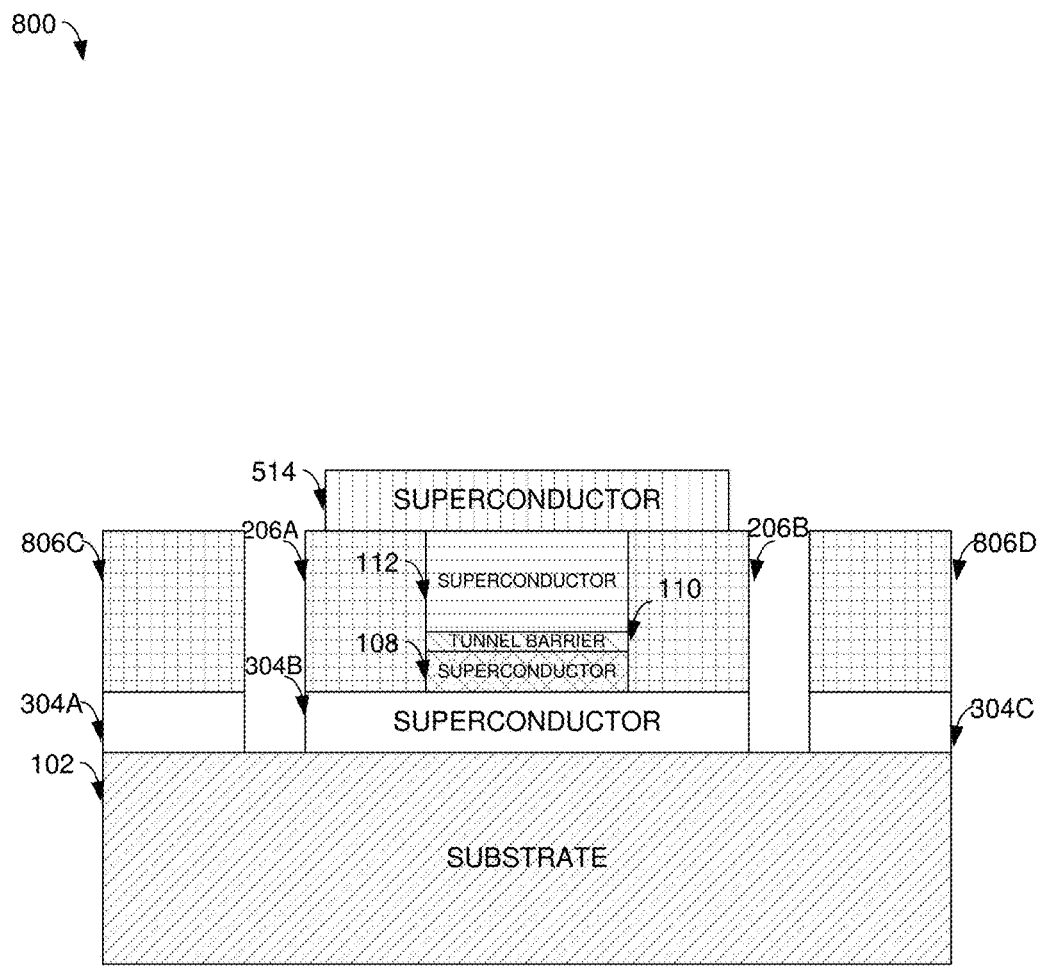
FIG. 8 illustrates the example, non-limiting chip surface base device structure of FIG. 1 after removing some material to form another vertical transmon qubit in accordance with one or more embodiments described herein.

FIG. 8 illustrates the example, non-limiting chip surface base device structure of FIG. 1 after removing some material to form another vertical transmon qubit in accordance with one or more embodiments described herein. Chip surface base device structure 800 is similar to chip surface base device structure 300, though in chip surface base device structure 800 substrate 806C and substrate 806D are present (because they have not been etched away). By having substrate 806C and substrate 806D, superconductor 304A and superconductor 304B are covered from exposure to air, and thus have an increased protection against oxidation relative to chip surface base device structure 300. This configuration in chip surface base device structure 800 can modify a metal-air contribution over resonators as compared to the configuration in chip surface base device structure 500, for example.

Figure 9:
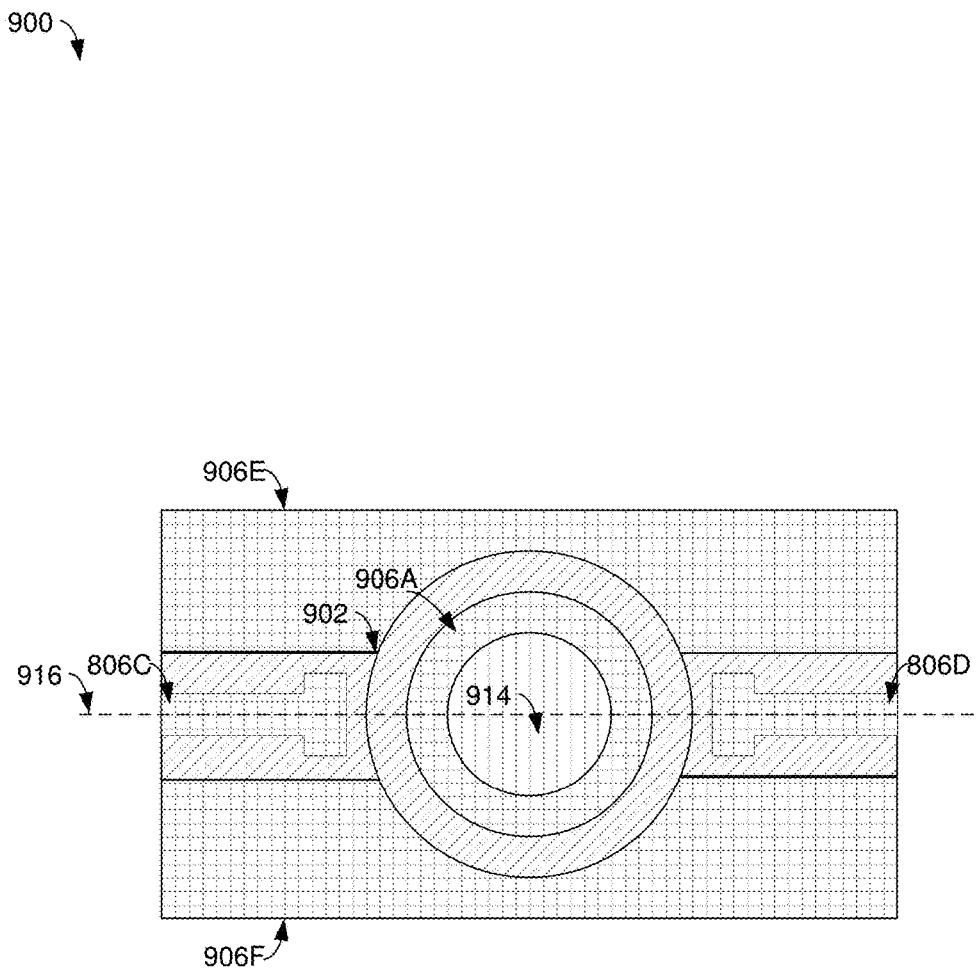
FIG. 9 illustrates a top view of the example, non-limiting chip surface base device structure of FIG. 8 in accordance with one or more embodiments described herein.

FIG. 9 illustrates a top view of the example, non-limiting chip surface base device structure of FIG. 8 in accordance with one or more embodiments described herein. Dashed line 916 indicates where the cross-sectional side view of chip surface base device structure 800 occurs relative to chip surface base device structure 900. Whereas chip surface base device structure 800 illustrates a side view of a chip surface base device structure, chip surface base device structure 900 illustrates a corresponding top view of this chip surface base device structure. With chip surface base device structure 900, the vertical transmon qubit is formed into a circular shape (in contrast to the rectangular shape of the vertical transmon qubit of chip surface base device structure 1000).

Chip surface base device structure 900 features circular capacitor pad shapes. Substrate 906A comprises both substrate 106A and substrate 106B, in an embodiment where they are formed into a circular shape. From a side view, substrate 106A and substrate 106B appear to be separated by the vertical Josephson junction. However, from a top view, they can be seen to be connected, as represented by substrate 906A. Superconductor 914 comprises superconductor 414 in an embodiment where superconductor 414 is configured in a circular shape. Similarly, substrate 902 comprises substrate 102 in an embodiment where substrate 102 is configured in a substantially circular shape.

Substrate 906D and substrate 906E include some substrate that is not seen when considering the cross-sectional view of FIG. 8. In chip surface base device structure 900, multiple qubits can be connected through the same circuit.

Figure 10:
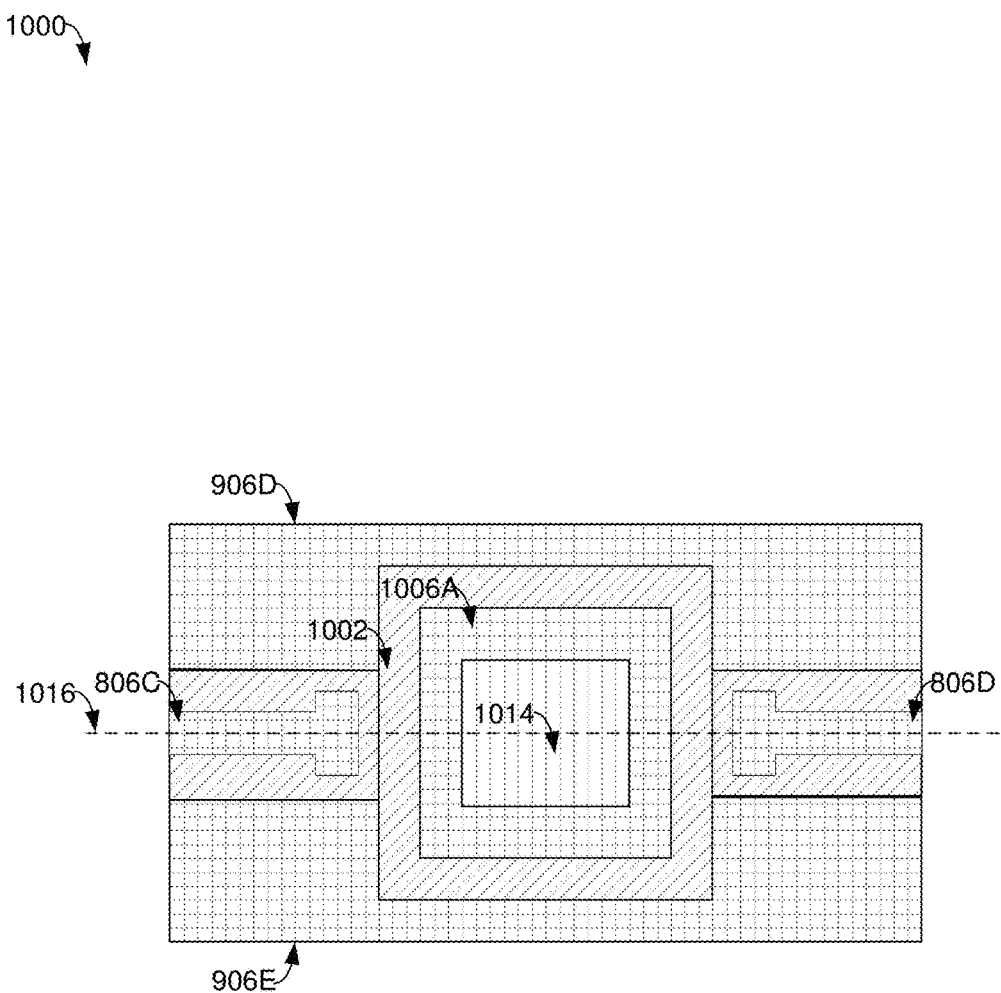
FIG. 10 illustrates a top view of the example, non-limiting chip surface base device structure of FIG. 8 in accordance with one or more embodiments described herein.

FIG. 10 illustrates a top view of the example, non-limiting chip surface base device structure of FIG. 10 in accordance with one or more embodiments described herein. Dashed line 1016 indicates where the cross-sectional side view of chip surface base device structure 800 occurs relative to chip surface base device structure 1000. Whereas chip surface base device structure 800 illustrates a side view of a chip surface base device structure, chip surface base device structure 1000 illustrates a corresponding top view of this chip surface base device structure. With chip surface base device structure 1000, the vertical transmon qubit is formed into a rectangular shape (in contrast to the circular shape of the vertical transmon qubit of chip surface base device structure 900).

Chip surface base device structure 1000 features rectangular capacitor pad shapes. Substrate 1006A comprises both substrate 106A and substrate 106B, in an embodiment where they are formed into a rectangular (or square) shape. From a side view, substrate 106A and substrate 106B appear to be separated by the vertical Josephson junction. However, from a top view, they can be seen to be connected, as represented by substrate 1006A. Superconductor 1014 comprises superconductor 414 in an embodiment where superconductor 414 is configured in a rectangular (or square) shape. Similarly, substrate 1002 comprises substrate 102 in an embodiment where substrate 102 is configured in a substantially rectangular (or square) shape.

Given this configuration, chip surface base device structure 1000 can be considered to have an etched island layout.

Figure 11:
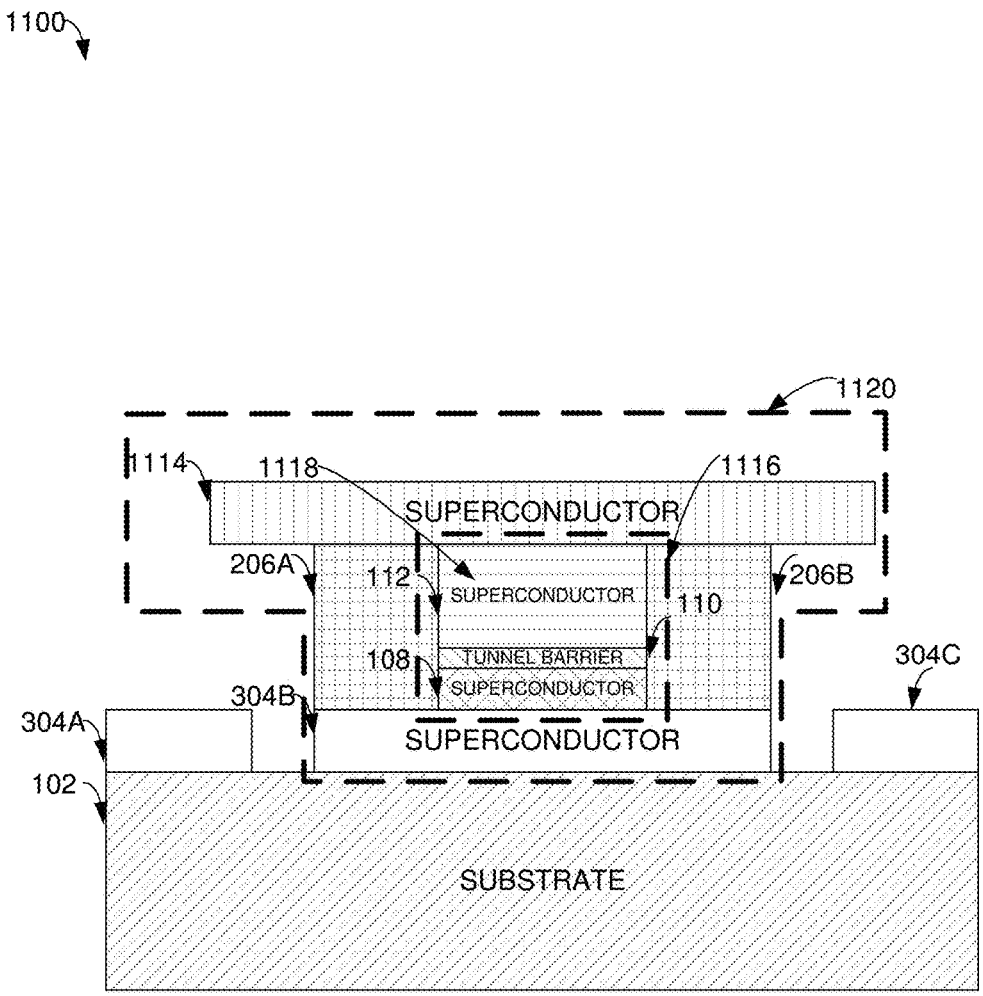
FIG. 11 illustrates the example, non-limiting chip surface base device structure of FIG. 1 after both adding and removing some material to form another vertical transmon qubit in accordance with one or more embodiments described herein.

FIG. 11 illustrates the example, non-limiting chip surface base device structure of FIG. 1 after both adding and removing some material to form another vertical transmon qubit 1120 in accordance with one or more embodiments described herein. A difference between chip surface base device structure 1100 and chip surface base device structure 300 is that, in chip surface base device structure 1100, superconductor 1114 extends wider than superconductor 214 of chip surface base device structure 300. That is, superconductor 1114 (also referred to as top plate) extends wider than superconductor 304B. In some examples, superconductor 1114 can extend such that it extends past both the space between superconductor 304A and superconductor 304B, and the space between superconductor 304B and superconductor 304C. In some examples, superconductor 1114 extends over at least part of one or both of superconductor 304A and superconductor 304B.

By elongating superconductor 1114 relative to other top plates, this elongation of the top plate can provide for coupling away from the associated vertical Josephson junction 1116 (which is formed in a via 1118 of superconductor 206A and superconductor 206B). In other embodiments, while the top plate is elongated, it does not overlap with the superconductor below it (i.e., superconductor 304A and superconductor 304C), which can comprise outside circuit islands.

In some examples, superconductor 304A (or 304C) can be part of an information transfer circuit which is communicatively coupled to the transmon qubit 1120 (or 350, or 450, or 550). In different examples, the information transfer circuit may comprise input, output, or read circuitry, or one or more resonant buses.

In some examples, at least part of the second superconducting material 304A (or 304C) can be located outside of the transmon qubit, and is used as a resonant bus 304A (or 304C). In some examples, the at least part of the second superconducting material that is located outside of the transmon qubit can be covered by the crystalline substrate (e.g., similar to how crystalline substrate 806C in FIG. 8 covers some superconductor 304A).

In some examples, a resonant bus 304C can electrically couple the transmon qubit to a second transmon qubit, to input, output, or read circuitry, or to a second resonant bus 304A, and the resonant bus 304C is formed on the second superconducting material (e.g., superconductor 304B). In some examples, the resonant bus 304A (or 304B) can be covered by the crystalline substrate (e.g., similar to how crystalline substrate 806C in FIG. 8 covers some of superconductor 304A).

In some examples, a resonant bus 304C can electrically couple the transmon qubit to one other superconducting qubit, to input, output, or read circuitry, or a second resonant bus 304A, and the resonant bus 304C is formed on the second superconducting material (e.g., superconductor 304B). In some examples, the resonant bus 304A (or 304B) can be covered by the crystalline substrate (e.g., similar to how crystalline substrate 806C in FIG. 8 covers some of superconductor 304A)

Figure 12:
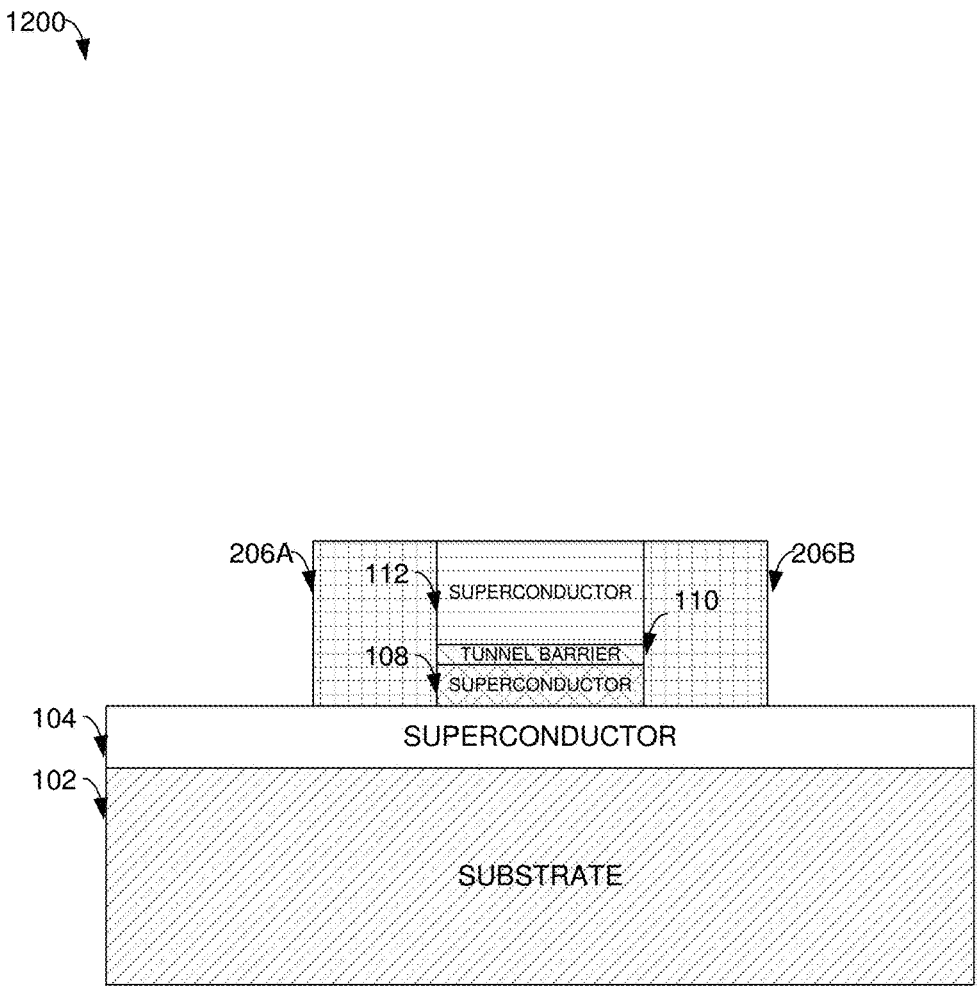
FIG. 12 illustrates the example, non-limiting chip surface base device structure of FIG. 1 after initially removing some material in the course of forming the vertical transmon qubit of FIG. 11 in accordance with one or more embodiments described herein.

FIG. 12 illustrates the example, non-limiting chip surface base device structure of FIG. 1 after initially removing some material in the course of forming the vertical transmon qubit 1120 of FIG. 11 in accordance with one or more embodiments described herein. It can be appreciated that chip surface base device structure 1200 is similar to chip surface base device structure 200, but without superconductor 214. It can further be appreciated that there can be embodiments where chip surface base device structure 1200 is created by starting with a different chip surface base device structure than chip surface base device structure 100, such as a chip surface base device structure that omits superconductor 114. In some examples, chip surface base device structure 1200 is created from chip surface base device structure 100 using a mask and RIE approach.

Figure 13:
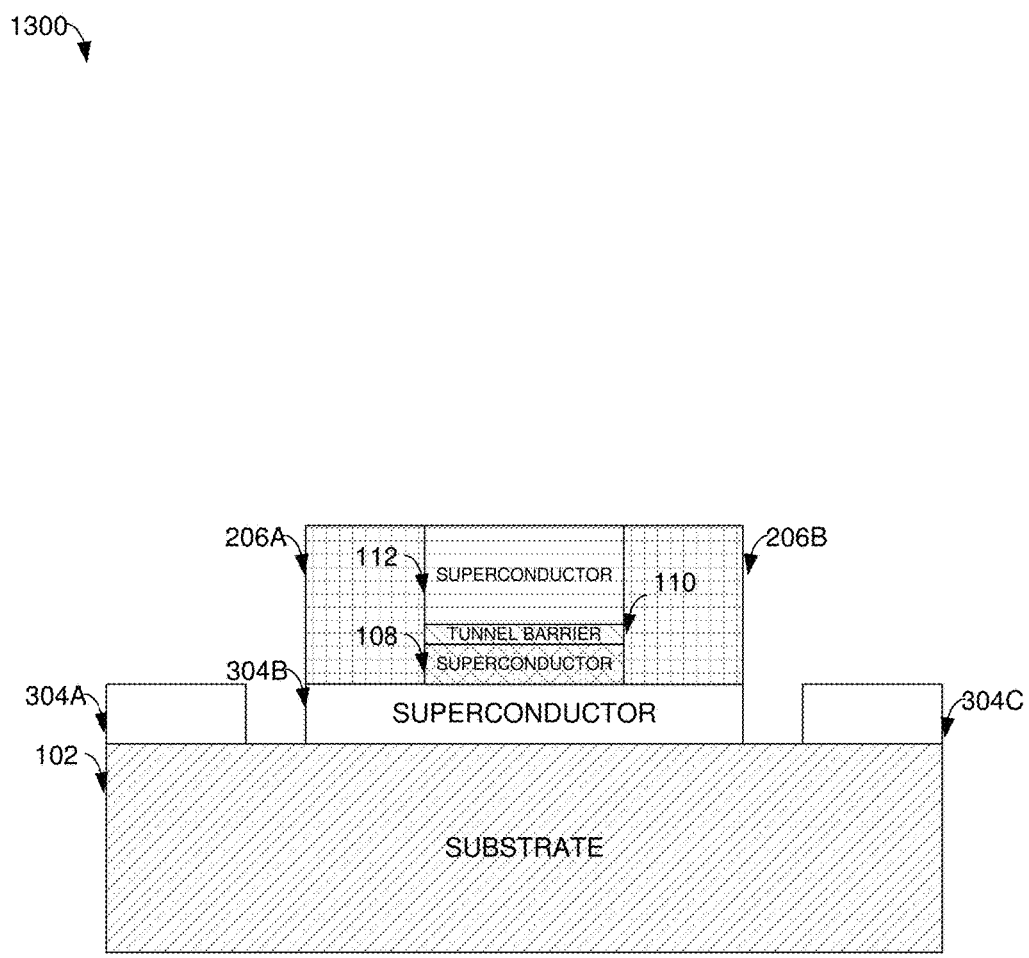
FIG. 13 illustrates the example, non-limiting chip surface base device structure of FIG. 12 after removing some material in accordance with one or more embodiments described herein.

FIG. 13 illustrates the example, non-limiting chip surface base device structure of FIG. 12 after removing some material in accordance with one or more embodiments described herein. It can be appreciated that chip surface base device structure 1300 is similar to chip surface base device structure 300, but without superconductor 214. A way in the chip surface base device structure 1300 differs from chip surface base device structure 1200 is that, in chip surface base device structure 1300 and relative to chip surface base device structure 1200, a portion of superconductor 104 has been removed to produce superconductor 304A, superconductor 304B, superconductor 304C. Additionally, the space between superconductor 304A and superconductor 304B and the space between superconductor 304B and superconductor 304C may be larger in chip surface base device structure 1300 than in chip surface base device structure 300. In some examples, chip surface base device structure 1300 is created from chip surface base device structure 1200 using a mask and RIE approach.

Figure 14:
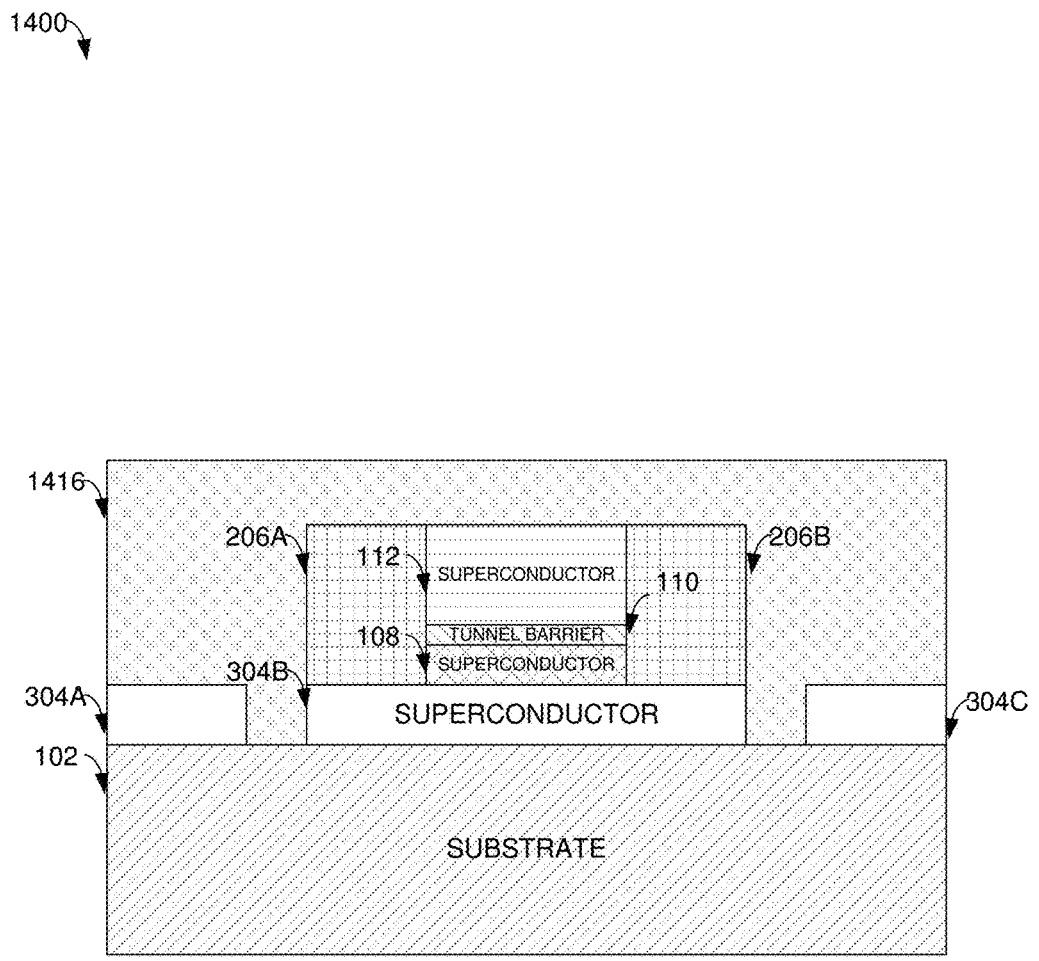
FIG. 14 illustrates the example, non-limiting chip surface base device structure of FIG. 13 after adding some material in accordance with one or more embodiments described herein.

FIG. 14 illustrates the example, non-limiting chip surface base device structure of FIG. 13 after adding some material in accordance with one or more embodiments described herein. The material added in chip surface base device structure 1400 relative to chip surface base device structure 1300 is sacrificial material 1416. Sacrificial material 1416 is added to provide a platform on which to eventually add superconductor 1114, and then sacrificial material 1416 is ultimately removed.

In some examples, sacrificial material 1416 can comprise oxide. In other examples, rather than using a sacrificial material that will later be completely removed, epitaxial silicon can be used in addition to, or instead of, a sacrificial material, where at least some epitaxial silicon will remain in a resulting chip surface base device structure that comprises a vertical transmon qubit.

Figure 15:
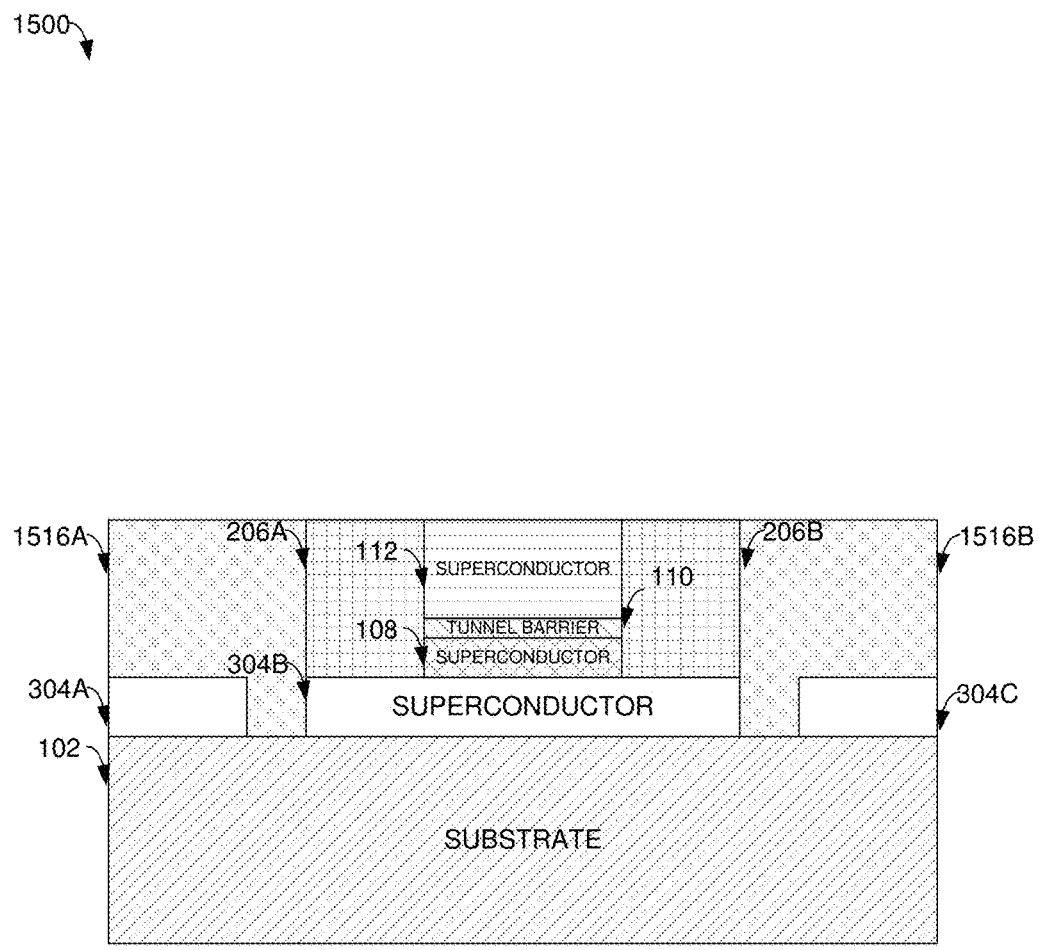
FIG. 15 illustrates the example, non-limiting chip surface base device structure of FIG. 14 after removing some material in accordance with one or more embodiments described herein.

FIG. 15 illustrates the example, non-limiting chip surface base device structure of FIG. 14 after removing some material in accordance with one or more embodiments described herein. In chip surface base device structure 1500 and relative to chip surface base device structure 1400, a portion of sacrificial material 1416 has been removed to produce sacrificial material 1516A and sacrificial material 1516B. Stated another way, sacrificial material has been removed down to the topmost level of substrate 206A, substrate 206B, and superconductor 112. In examples where sacrificial material 1516A comprises silicon, CMP can be used to remove material. In examples where sacrificial material 1516A comprises an oxide, RIE can be used to remove material.

Figure 16:
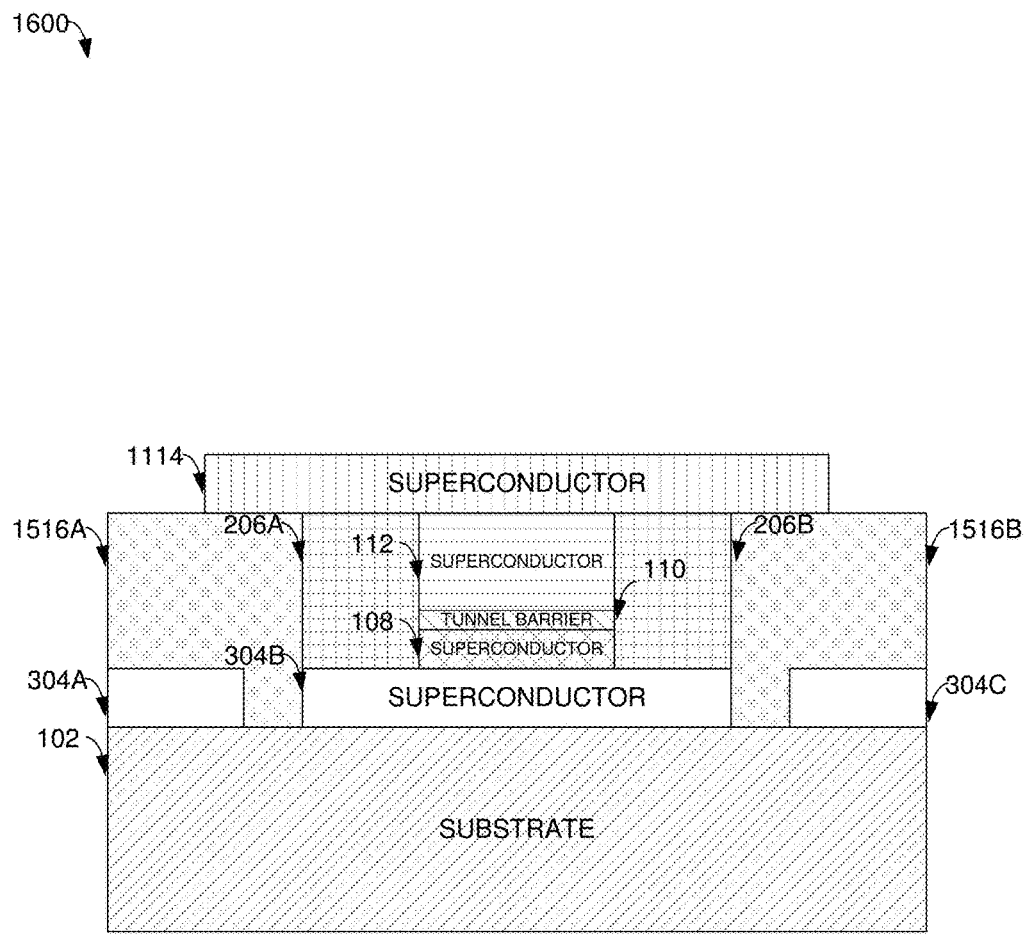
FIG. 16 illustrates the example, non-limiting chip surface base device structure of FIG. 15 after adding some material in accordance with one or more embodiments described herein.

FIG. 16 illustrates the example, non-limiting chip surface base device structure of FIG. 15 after adding some material in accordance with one or more embodiments described herein. In chip surface base device structure 1600 and relative to chip surface base device structure 1500, superconductor 1114 has been added. Sacrificial material 1516A and sacrificial material 1516B provide support on which superconductor 1114 can rest while superconductor 1114 is being added to chip surface base device structure 1600.

Then, sacrificial material 1516A and sacrificial material 1516B can be removed to produce chip surface base device structure 1100 of FIG. 11. In some examples, sacrificial material 1516A and sacrificial material 1516B can be removed with a vapor phase etch, such as with hydrogen fluorine (HF).

Figure 17:
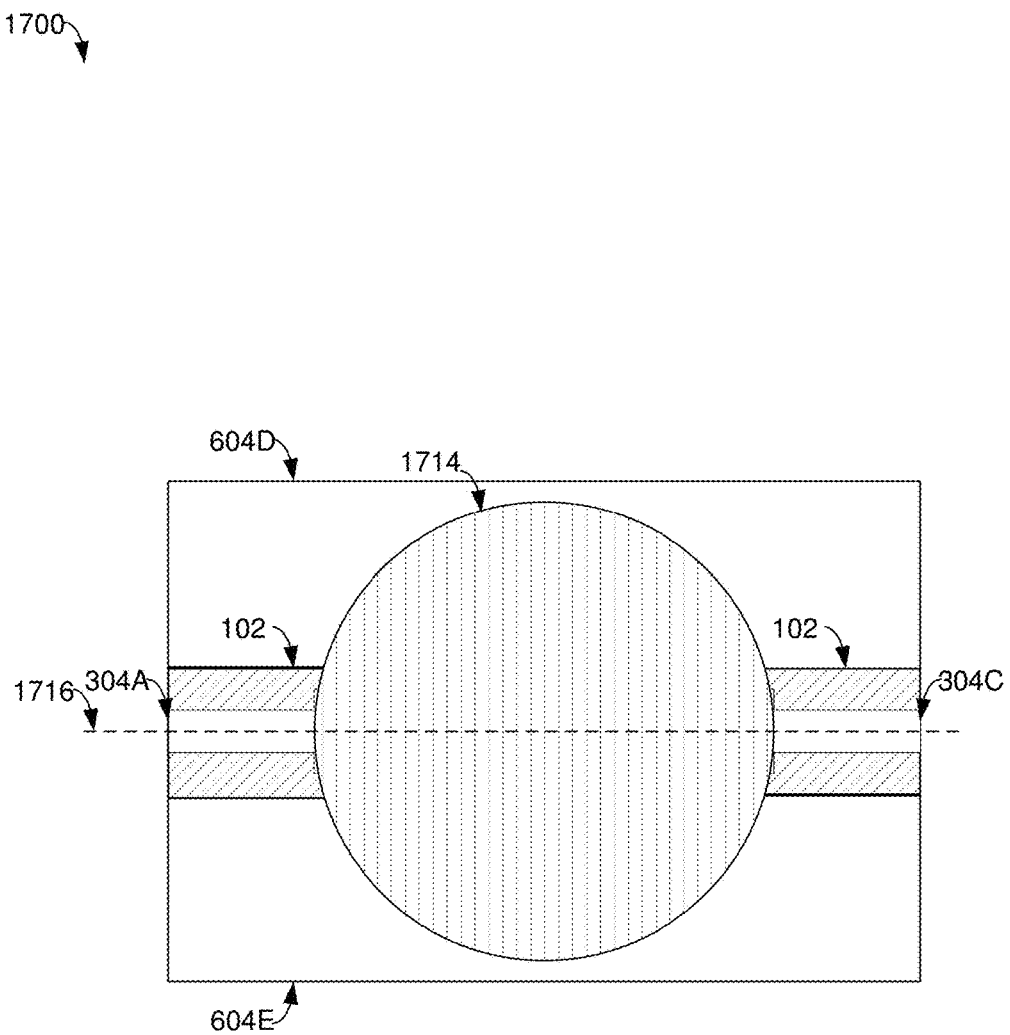
FIG. 17 illustrates a top view of the example, non-limiting chip surface base device structure of FIG. 11 in accordance with one or more embodiments described herein.

FIG. 17 illustrates a top view of the example, non-limiting chip surface base device structure of FIG. 11 in accordance with one or more embodiments described herein. Whereas chip surface base device structure 1100 illustrates a cross-sectional side view of a chip surface base device structure, chip surface base device structure 1700 illustrates a corresponding top view of this chip surface base device structure. The placement of the cross-sectional side view of FIG. 11 relative to the top view of FIG. 17 is illustrated with line 1716. With chip surface base device structure 1700, the vertical transmon qubit is formed into a circular shape (in contrast to the rectangular shape of the vertical transmon qubit of chip surface base device structure 1800). Superconductor 1714 comprises superconductor 1114, in an embodiment where superconductor 1114 is formed into a circular shape.

Chip surface base device structure 1700 features circular capacitor pad shapes. In chip surface base device structure 1700, multiple qubits can be connected through the same circuit.

Figure 18:
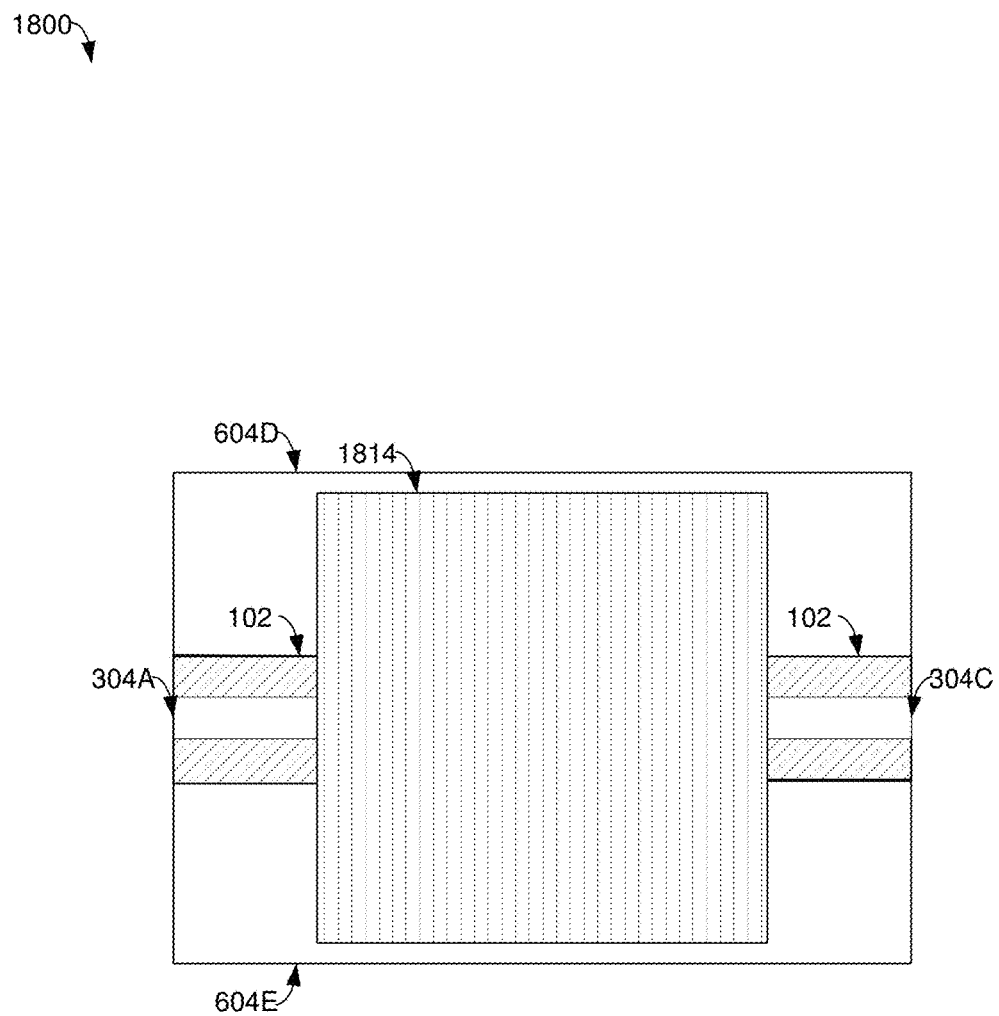
FIG. 18 illustrates another top view of the example, non-limiting chip surface base device structure of FIG. 11 in accordance with one or more embodiments described herein.

FIG. 18 illustrates another top view of the example, non-limiting chip surface base device structure of FIG. 11 in accordance with one or more embodiments described herein. Whereas chip surface base device structure 1100 illustrates a side view of a chip surface base device structure, chip surface base device structure 1800 illustrates a corresponding top view of this chip surface base device structure. With chip surface base device structure 1800, the vertical transmon qubit is formed into a rectangular shape (in contrast to the circular shape of the vertical transmon qubit of chip surface base device structure 1700). Superconductor 1814 comprises superconductor 1114, in an embodiment where superconductor 1114 is formed into a circular shape.

Chip surface base device structure 1800 features rectangular capacitor pad shapes. Given this configuration, chip surface base device structure 1800 can be considered to have an etched island layout.

Figure 19:
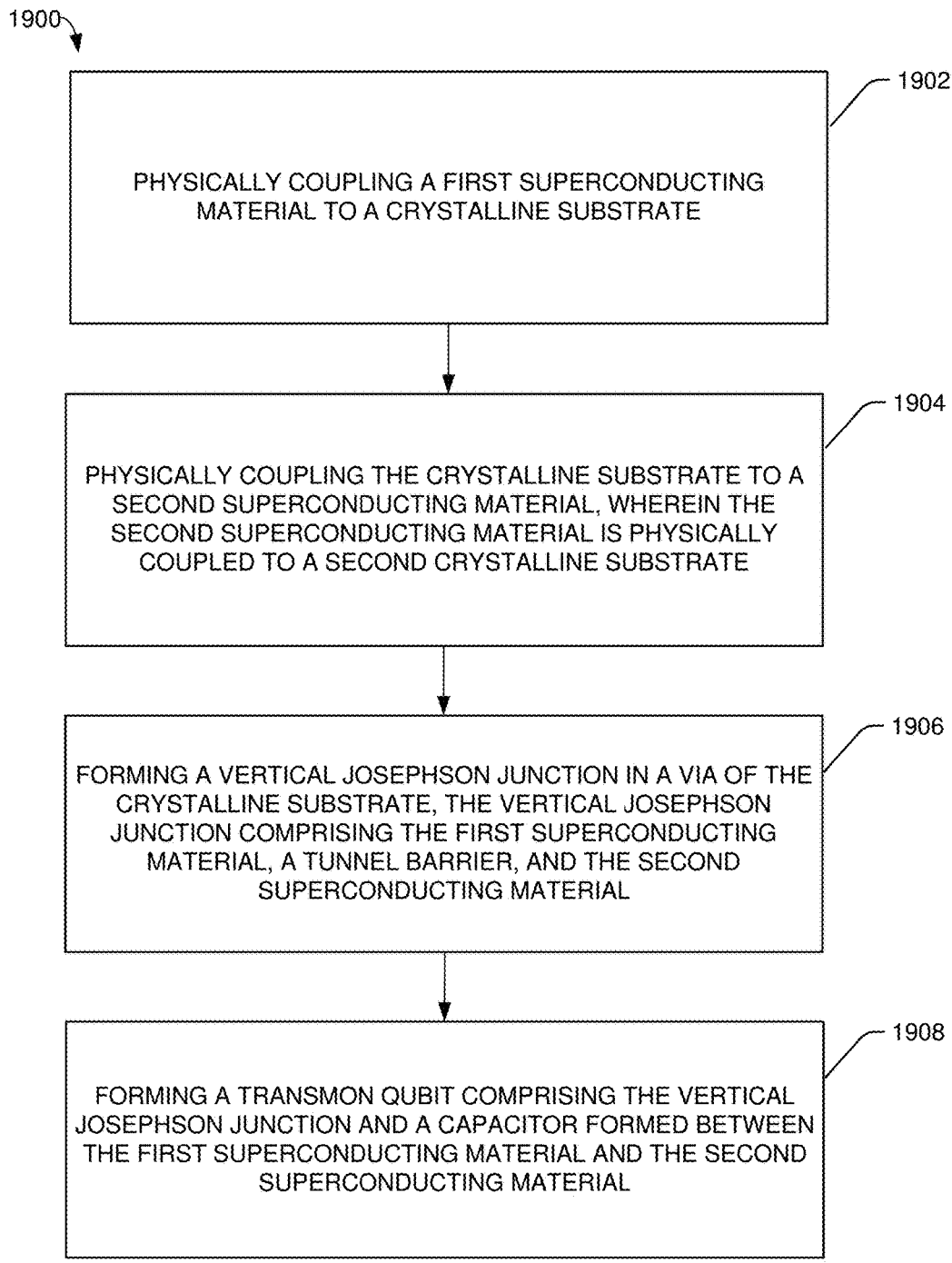
FIG. 19 illustrates a flow diagram of an example, non-limiting computer-implemented method that facilitates implementing a vertical transmon qubit device in accordance with one or more embodiments described herein.

FIG. 19 illustrates a flow diagram of an example, non-limiting computer-implemented method that facilitates implementing a vertical transmon qubit device in accordance with one or more embodiments described herein. In some examples, flow diagram 1900 can be implemented by computer 2112. It can be appreciated that the operations of flow diagram 1900 can be implemented in a different order than is depicted. It can also be appreciated that the operations of flow diagram 1900 can be implemented in a different order than is depicted.

In non-limiting example embodiments, a computing device (or system) (e.g., computer 2112) is provided comprising one or more processors and one or more memories that stores executable instructions that, when executed by the one or more processors, can facilitate performance of the operations as described herein, including the non-limiting methods as illustrated in the flow diagrams of FIG. 19. As a non-limiting example, the one or more processors can facilitate performance of the methods by directing or controlling one or more equipment operable to perform semiconductor fabrication.

An advantage of a method such as depicted in FIG. 19 can be that it can be used to fabricate vertical transmon qubit devices that allow for scaling due to a reduced capacitor footprint as compared to other types of capacitors.

Operation 1902 depicts physically coupling (e.g., by computer 2112) a first superconducting material to a crystalline substrate. As used herein, physically coupling two materials can refer to mechanically or chemically coupling those materials, and can be distinguished from electrically coupling, which can involve configuring two things to transfer electric signals between themselves. In some examples, this physical coupling arrangement can be referred as the various materials being stacked upon each other, and can comprise a SOM base. Operation 1904 depicts physically coupling (e.g., by computer 2112) the crystalline substrate to a second superconducting material, wherein the second superconducting material is physically coupled to a second crystalline substrate.

In some examples, this operation includes removing a portion of the substrate such that an edge of the substrate is located within an edge of the second superconducting material. For instance, in chip surface base device structure 400, the substrate can be substrate 406A and substrate 406B, and the second superconducting material can be superconductor 304B. In this example, it can be seen that superconductor 304B extends horizontally further away from the transmon than either substrate 406A or substrate 406B. Thus, the edges of substrate 406A and substrate 406B that extend away from the transmon are located within the edges of superconductor 304B that extend away from the transmon.

In some examples, this operation includes removing a portion of the superconducting material such that an edge of the superconducting material is flush with the edge of the substrate. For instance, in chip surface base device structure 400, the substrate can be substrate 406A and substrate 406B, and the superconducting material can be superconductor 414. In this example, it can be seen that superconductor 414 extends horizontally the same amount from the transmon as both substrate 406A or substrate 406B do. Thus, the edges of superconductor 414 that extend away from the transmon are flush with the edges of substrate 406A and substrate 406B that extend away from the transmon.

In some examples, this operation includes removing a portion of the superconducting material such that an edge of the superconducting material is located within an edge of the substrate. For instance, in chip surface base device structure 500, the substrate can be substrate 206A and substrate 206B, and the superconducting material can be superconductor 514. In this example, it can be seen that substrate 206A and substrate 206B extend horizontally further away from the transmon than superconductor 514 does. Thus, the edges of superconductor 514 that extend away from the transmon are located within the edges of substrate 206A and substrate 206B that extend away from the transmon.

Operation 1906 depicts forming (e.g., by computer 2112) a vertical Josephson junction in a via of the crystalline substrate, the vertical Josephson junction comprising the first superconducting material, a tunnel barrier, and the second superconducting material.

For example, in chip surface base device structure 100, the vertical Josephson junction can comprise superconductor 108, tunnel barrier 110 (serving as the tunnel barrier here), and superconductor 112. This vertical Josephson junction is formed in a via of substrate 106A and substrate 106B (which can have been a continuous section of substrate before a via was formed in it, leaving substrate 106A and substrate 106B).

Operation 1908 depicts forming (e.g., by computer 2112) a transmon qubit comprising the vertical Josephson junction and a capacitor formed between the first superconducting material and the second superconducting material.

In some examples, forming a vertical transmon qubit comprising the vertical Josephson junction and a capacitor comprises forming a second vertical transmon qubit from the superconducting material and the substrate that is isolated from cross talk from the vertical transmon qubit by a space in the second superconducting material. That is, a chip surface base device structure, such as chip surface base device structure 100, can comprise multiple vertical transmon qubits, and these multiple vertical transmon qubits can be isolated from cross talk with each other. In some examples where a chip surface base device structure comprises multiple vertical transmon qubits, or multiple vertical transmon qubits are present, a resonant bus can couple the vertical transmon qubit and the second vertical transmon qubit.

In some examples, a resonant bus is coupled to the second superconducting material. For example, this second superconducting material can comprise superconductor 304A or superconductor 304C of chip surface base device structure 300, and a resonant bus can be part of or coupled to superconductor 304A or superconductor 304C.

In some examples, the first superconducting material comprises a resonant bus. For example, in chip surface base device structure 100, as the vertical Josephson junction is isolated, some of superconductor 114 that is away from the vertical Josephson junction can remain, and this part of superconductor 114 can serve as a resonant bus.

Similarly, in some examples, the resonant bus is coupled to the superconducting material, and using chip surface base device structure 100 as an example, as the vertical Josephson junction is isolated, some of superconductor 114 that is away from the vertical Josephson junction can remain, and this part of superconductor 114 can serve as a resonant bus.

In some examples, a resonant bus is coupled to the vertical transmon qubit, and a second resonant bus is coupled to the vertical transmon qubit. For example, in FIG. 6, both superconductor 304A and superconductor 304C can serve as resonant buses. So, superconductor 304A can be the resonant bus that is coupled to the vertical transmon qubit, and superconductor 304C can be the second resonant bus that is coupled to the vertical transmon qubit. In some examples, more than two resonant busses can be coupled to the vertical transmon qubit.

In some examples, a readout resonator couples to and addresses the vertical transmon qubit without coupling to a second vertical transmon qubit of the chip surface base device structure. A chip surface base device structure can comprise multiple vertical transmon qubits. Where a chip surface base device structure can comprise multiple vertical transmon qubits, a particular readout resonator can couple to just one of these vertical transmon qubits. For example, in chip surface base device structure 600, superconductor 304A can serve as a readout resonator, and it can be coupled to one vertical transmon qubit.

In some examples, the vertical transmon qubit comprises a vertical transmon qubit. A vertical transmon qubit can generally be a vertical transmon qubit that comprises a vertical Josephson junction. A vertical Josephson junction is present, for example, in chip surface base device structure 100, where the vertical Josephson junction comprises superconductor 108, tunnel barrier 110, and superconductor 112.

In some examples, this operation can comprise coupling a resonator to a first side of the superconducting material, such that the superconducting material comprises a one-sided coupling. A one-sided coupling generally comprises one resonator coupled to a vertical transmon qubit. In chip surface base device structure 600, where superconductor 304A serves as a resonator, and superconductor 304C is omitted, superconductor 304A can serve as a one-sided coupler, thus forming a one-sided coupling.

In some examples, this operation comprises coupling a first resonator to a first side of the superconducting material, and coupling a second resonator to a second side of the superconducting material, such that the superconducting material comprises a multiple-sided coupling (i.e., multiple resonators electrically couple to multiple sides of the first superconducting material). A multiple-sided coupling generally comprises multiple resonators coupled to one vertical transmon qubit. In chip surface base device structure 600, where both superconductor 304A and superconductor 304C each serve as a resonator, chip surface base device structure 600 can have a multiple-sided coupling.

In some examples, a portion of the second superconducting material that is located outside of vertical Josephson junction is exposed to air. For instance, in chip surface base device structure 300, the portion of the superconducting material that is located outside of the vertical Josephson junction can be superconductor 304A and superconductor 304C. Superconductor 304A and superconductor 304C can be considered to be exposed to air because they are not covered by another material, such as a substrate. This arrangement can be seen in contrast to chip surface base device structure 800, where superconductor 304A and superconductor 304C can be said to not be exposed to air because they are covered by substrate 806C and substrate 806D, respectively.

In some examples, this operation comprises covering a portion of the second superconducting material that is located outside of the Vertical Josephson junction with the substrate, such that a portion of the second superconducting material that is located outside of the vertical Josephson junction is covered by the substrate. For instance, in chip surface base device structure 800, the portion of the second superconducting material can be superconductor 304A and superconductor 304C. As can be seen with chip surface base device structure, superconductor 304A and superconductor 304C are covered by substrate 806C and substrate 806D, respectively. By covering superconductor 304A and superconductor 304C with substrate 806C and substrate 806D, respectively, the top interfaces of superconductor 304A and superconductor 304C are changed and superconductor 304A and superconductor 304C can be protected against oxidation as a result of being exposed to air.

Figure 20:
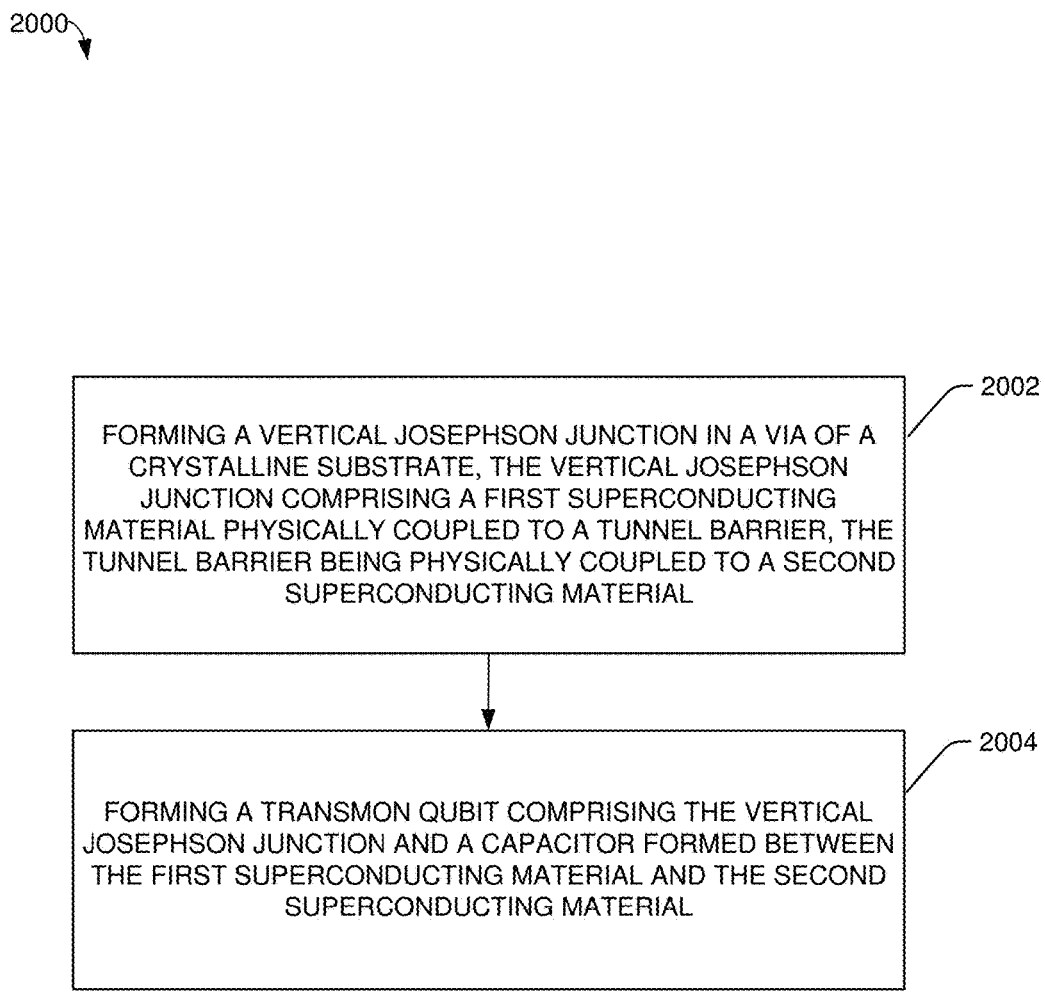
FIG. 20 illustrates another flow diagram of an example, non-limiting computer-implemented method that facilitates implementing a vertical Josephson junction superconducting device in accordance with one or more embodiments described herein.

FIG. 20 illustrates a flow diagram of an example, non-limiting computer-implemented method that facilitates implementing a vertical transmon qubit device in accordance with one or more embodiments described herein. In some examples, flow diagram 2000 can be implemented by computer 2112. It can be appreciated that the operations of flow diagram 2000 can be implemented in a different order than is depicted. It can also be appreciated that the operations of flow diagram 1900 can be implemented in a different order than is depicted.

In non-limiting example embodiments, a computing device (or system) (e.g., computer 2112) is provided comprising one or more processors and one or more memories that stores executable instructions that, when executed by the one or more processors, can facilitate performance of the operations as described herein, including the non-limiting methods as illustrated in the flow diagrams of FIG. 20. As a non-limiting example, the one or more processors can facilitate performance of the methods by directing or controlling one or more equipment operable to perform semiconductor fabrication.

An advantage of a method such as depicted in FIG. 20 can be that it can be used to fabricate vertical transmon qubit devices that allow for scaling due to a reduced capacitor footprint as compared to other types of capacitors.

Operation 2002 depicts forming (e.g., by computer 2112) a vertical Josephson junction in a via of a crystalline substrate, the vertical Josephson junction comprising a first superconducting material physically coupled to a tunnel barrier, the tunnel barrier being physically coupled to a second superconducting material. As used herein, physically coupling two materials can refer to mechanically or chemically coupling those materials, and can be distinguished from electrically coupling, which can involve configuring two things to transfer electric signals between themselves. In some examples, this physical coupling arrangement can be referred as the various materials being stacked upon each other, and can comprise a SOM base.

For example, in chip surface base device structure 100, the vertical Josephson junction can comprise superconductor 108, tunnel barrier 110 (serving as the tunnel barrier here), and superconductor 112. This vertical Josephson junction is formed in a via of substrate 106A and substrate 106B (which can have been a continuous section of substrate before a via was formed in it, leaving substrate 106A and substrate 106B).

In some examples, this operation includes removing a portion of the substrate such that an edge of the substrate is located within an edge of the second superconducting material. For instance, in chip surface base device structure 400, the substrate can be substrate 406A and substrate 406B, and the second superconducting material can be superconductor 304B. In this example, it can be seen that superconductor 304B extends horizontally further away from the transmon than either substrate 406A or substrate 406B. Thus, the edges of substrate 406A and substrate 406B that extend away from the transmon are located within the edges of superconductor 304B that extend away from the transmon.

In some examples, this operation includes removing a portion of the superconducting material such that an edge of the superconducting material is flush with the edge of the substrate. For instance, in chip surface base device structure 400, the substrate can be substrate 406A and substrate 406B, and the superconducting material can be superconductor 414. In this example, it can be seen that superconductor 414 extends horizontally the same amount from the transmon as both substrate 406A or substrate 406B do. Thus, the edges of superconductor 414 that extend away from the transmon are flush with the edges of substrate 406A and substrate 406B that extend away from the transmon.

In some examples, this operation includes removing a portion of the superconducting material such that an edge of the superconducting material is located within an edge of the substrate. For instance, in chip surface base device structure 500, the substrate can be substrate 206A and substrate 206B, and the superconducting material can be superconductor 514. In this example, it can be seen that substrate 206A and substrate 206B extend horizontally further away from the transmon than superconductor 514 does. Thus, the edges of superconductor 514 that extend away from the transmon are located within the edges of substrate 206A and substrate 206B that extend away from the transmon.

Operation 2004 depicts forming (e.g., by computer 2112) a transmon qubit comprising the vertical Josephson junction and a capacitor formed between the first superconducting material and the second superconducting material.

In some examples, forming a vertical transmon qubit comprising the vertical Josephson junction and a capacitor comprises forming a second vertical transmon qubit from the superconducting material and the substrate that is isolated from cross talk from the vertical transmon qubit by a space in the second superconducting material. That is, a chip surface base device structure, such as chip surface base device structure 100, can comprise multiple vertical transmon qubits, and these multiple vertical transmon qubits can be isolated from cross talk with each other. In some examples where a chip surface base device structure comprises multiple vertical transmon qubits, or multiple vertical transmon qubits are present, a resonant bus can couple the vertical transmon qubit and the second vertical transmon qubit.

In some examples, a resonant bus is coupled to the second superconducting material. For example, this second superconducting material can comprise superconductor 304A or superconductor 304C of chip surface base device structure 300, and a resonant bus can be coupled to superconductor 304A or superconductor 304C.

In some examples, the first superconducting material comprises a resonant bus. For example, in chip surface base device structure 100, as the vertical Josephson junction is isolated, some of superconductor 114 that is away from the vertical Josephson junction can remain, and this part of superconductor 114 can serve as a resonant bus.

Similarly, in some examples, the resonant bus is coupled to the superconducting material, and using chip surface base device structure 100 as an example, as the vertical Josephson junction is isolated, some of superconductor 114 that is away from the vertical Josephson junction can remain, and this part of superconductor 114 can serve as a resonant bus.

In some examples, a resonant bus is coupled to the vertical transmon qubit, and a second resonant bus is coupled to the vertical transmon qubit. For example, in FIG. 6, both superconductor 304A and superconductor 304C can serve as resonant buses. So, superconductor 304A can be the resonant bus that is coupled to the vertical transmon qubit, and superconductor 304C can be the second resonant bus that is coupled to the vertical transmon qubit. In some examples, more than two resonant busses can be coupled to the vertical transmon qubit.

In some examples, a readout resonator couples to and addresses the vertical transmon qubit without coupling to a second vertical transmon qubit of the chip surface base device structure. A chip surface base device structure can comprise multiple vertical transmon qubits. Where a chip surface base device structure can comprise multiple vertical transmon qubits, a particular readout resonator can couple to just one of these vertical transmon qubits. For example, in chip surface base device structure 600, superconductor 304A can serve as a readout resonator, and it can be coupled to one vertical transmon qubit.

In some examples, the vertical transmon qubit comprises a vertical transmon qubit. A vertical transmon qubit can generally be a vertical transmon qubit that comprises a vertical Josephson junction. A vertical Josephson junction is present, for example, in chip surface base device structure 100, where the vertical Josephson junction comprises superconductor 108, tunnel barrier 110, and superconductor 112.

In some examples, this operation can comprise coupling a resonator to a first side of the superconducting material, such that the superconducting material comprises a one-sided coupling. A one-sided coupling generally comprises one resonator coupled to a vertical transmon qubit. In chip surface base device structure 600, where superconductor 304A serves as a resonator, and superconductor 304C is omitted, superconductor 304A can serve as a one-sided coupler, thus forming a one-sided coupling.

In some examples, this operation comprises coupling a first resonator to a first side of the superconducting material, and coupling a second resonator to a second side of the superconducting material, such that the superconducting material comprises a multiple-sided coupling. A multiple-sided coupling generally comprises multiple resonators coupled to one vertical transmon qubit. In chip surface base device structure 600, where both superconductor 304A and superconductor 304C each serve as a resonator, chip surface base device structure 600 can have a multiple-sided coupling.

In some examples, a portion of the second superconducting material that is located outside of vertical Josephson junction is exposed to air. For instance, in chip surface base device structure 300, the portion of the superconducting material that is located outside of the vertical Josephson junction can be superconductor 304A and superconductor 304C. Superconductor 304A and superconductor 304C can be considered to be exposed to air because they are not covered by another material, such as a substrate. This arrangement can be seen in contrast to chip surface base device structure 800, where superconductor 304A and superconductor 304C can be said to not be exposed to air because they are covered by substrate 806C and substrate 806D, respectively.

In some examples, this operation comprises covering a portion of the second superconducting material that is located outside of the Vertical Josephson junction with the substrate, such that a portion of the second superconducting material that is located outside of the vertical Josephson junction is covered by the substrate. For instance, in chip surface base device structure 800, the portion of the second superconducting material can be superconductor 304A and superconductor 304C. As can be seen with chip surface base device structure, superconductor 304A and superconductor 304C are covered by substrate 806C and substrate 806D, respectively. By covering superconductor 304A and superconductor 304C with substrate 806C and substrate 806D, respectively, the top interfaces of superconductor 304A and superconductor 304C are changed and superconductor 304A and superconductor 304C can be protected against oxidation as a result of being exposed to air.

Figure 21:
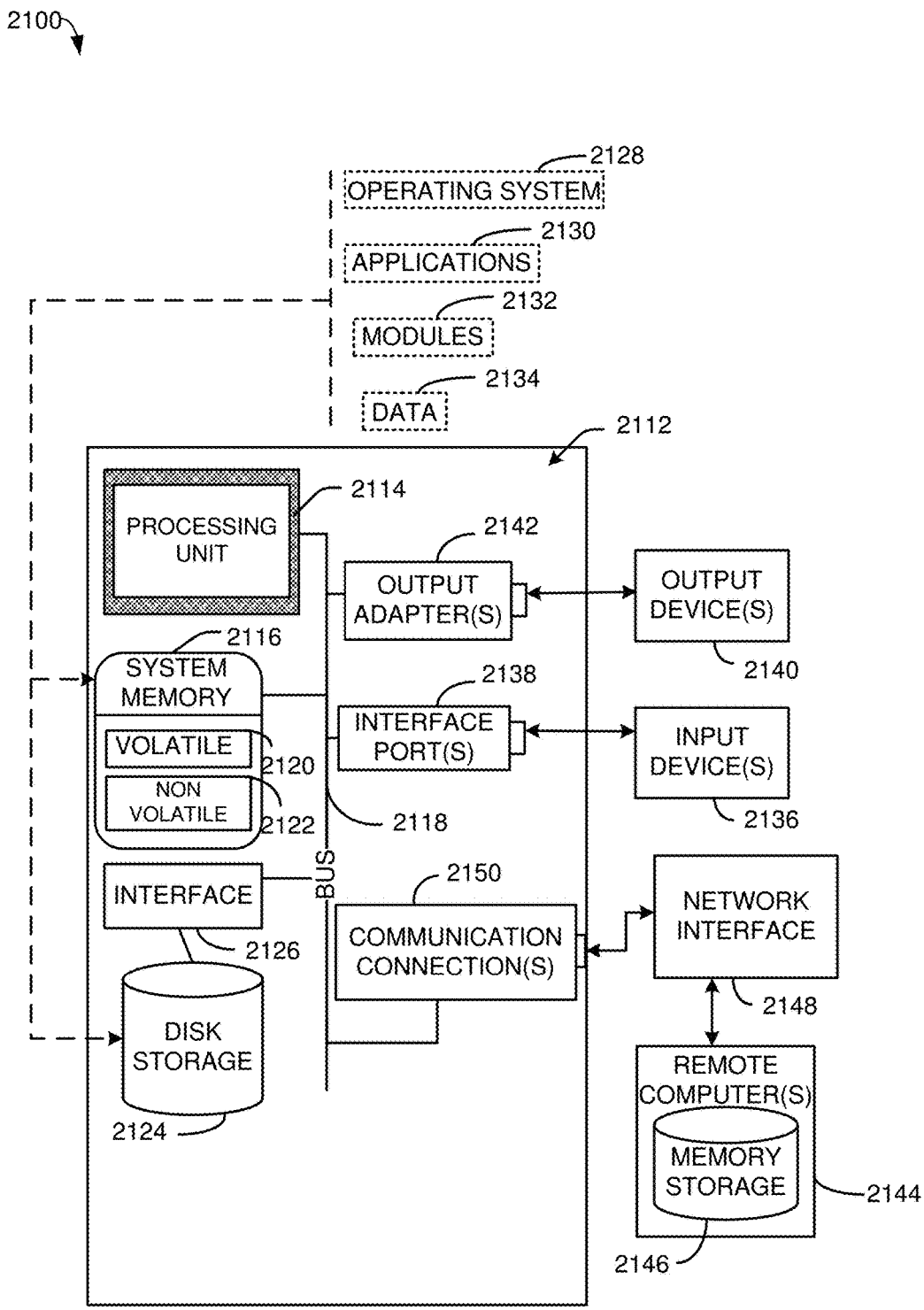
FIG. 21 illustrates a block diagram of an example, non-limiting operating environment in which one or more embodiments described herein can be facilitated.

In order to provide a context for the various aspects of the disclosed subject matter, FIG. 21 as well as the following discussion are intended to provide a general description of a suitable environment in which the various aspects of the disclosed subject matter can be implemented. For example, operating environment 2100 can be used to implement aspects of the example, non-limiting computer-implemented methods that facilitates implementing a vertical Josephson junction superconducting device of FIGS. 12 and 13.

FIG. 21 illustrates a block diagram of an example, non-limiting operating environment in which one or more embodiments described herein can be facilitated. Repetitive description of like elements employed in other embodiments described herein is omitted for sake of brevity. With reference to FIG. 21, a suitable operating environment 2100 for implementing various aspects of this disclosure can also include a computer 2112. The computer 2112 can also include a processing unit 2114, a system memory 2116, and a system bus 2118. The system bus 2118 couples system components including, but not limited to, the system memory 2116 to the processing unit 2114. The processing unit 2114 can be any of various available processors. Dual microprocessors and other multiprocessor architectures also can be employed as the processing unit 2114. The system bus 2118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 2116 can also include volatile memory 2120 and nonvolatile memory 2122. The basic input/output system (BIOS), containing the basic routines to transfer information between elements within the computer 2112, such as during start-up, is stored in nonvolatile memory 2122. By way of illustration, and not limitation, nonvolatile memory 2122 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 2120 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2112 can also include removable/non-removable, volatile/non-volatile computer storage media. FIG. 21 illustrates, for example, a disk storage 2124. Disk storage 2124 can also include, but is not limited to, devices like a magnetic disk drive, floppy disk drive, tape drive, Jaz drive, Zip drive, LS-100 drive, flash memory card, or memory stick. The disk storage 2124 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2124 to the system bus 2118, a removable or non-removable interface is typically used, such as interface 2126. FIG. 21 also depicts software that acts as an intermediary between users and the basic computer resources described in the suitable operating environment 2100. Such software can also include, for example, an operating system 2128. Operating system 2128, which can be stored on disk storage 2124, acts to control and allocate resources of the computer 2112.

System applications 2130 take advantage of the management of resources by operating system 2128 through program modules 2132 and program data 2134, e.g., stored either in system memory 2116 or on disk storage 2124. It is to be appreciated that this disclosure can be implemented with various operating systems or combinations of operating systems. A user enters commands or information into the computer 2112 through input device(s) 2136. Input devices 2136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2114 through the system bus 2118 via interface port(s) 2138. Interface port(s) 2138 include, for example, a serial port, a parallel port, a game port, and a universal serial bus (USB). Output device(s) 2140 use some of the same type of ports as input device(s) 2136. Thus, for example, a USB port can be used to provide input to computer 2112, and to output information from computer 2112 to an output device 2140. Output adapter 2142 is provided to illustrate that there are some output devices 2140 like monitors, speakers, and printers, among other output devices 2140, which require special adapters. The output adapters 2142 include, by way of illustration and not limitation, video and sound cards that provide a means of connection between the output device 2140 and the system bus 2118. It should be noted that other devices and/or systems of devices provide both input and output capabilities such as remote computer(s) 2144.

Computer 2112 can operate in a networked environment using logical connections to one or more remote computers, such as remote computer(s) 2144. The remote computer(s) 2144 can be a computer, a server, a router, a network PC, a workstation, a microprocessor based appliance, a peer device or other common network node and the like, and typically can also include many or all of the elements described relative to computer 2112. For purposes of brevity, only a memory storage device 2146 is illustrated with remote computer(s) 2144. Remote computer(s) 2144 is logically connected to computer 2112 through a network interface 2148 and then physically connected via communication connection 2150. Network interface 2148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2150 refers to the hardware/software employed to connect the network interface 2148 to the system bus 2118. While communication connection 2150 is shown for illustrative clarity inside computer 2112, it can also be external to computer 2112. The hardware/software for connection to the network interface 2148 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A chip surface base device structure, comprising:
a first superconducting material physically coupled to a crystalline substrate, wherein the crystalline substrate is physically coupled to a second superconducting material, and wherein the second superconducting material is physically coupled to a second crystalline substrate;
a vertical Josephson junction located in a via of the crystalline substrate, the vertical Josephson junction comprising the first superconducting material, a tunnel barrier, and the second superconducting material; and
a transmon qubit comprising the vertical Josephson junction and a capacitor formed between the first superconducting material and the second superconducting material.

2. The chip surface base device structure of claim 1, wherein at least part of the second superconducting material is located outside of the transmon qubit, and is used as an information transfer circuit.

3. The chip surface base device structure of claim 2, wherein the at least part of the second superconducting material that is located outside of the transmon qubit is covered by the crystalline substrate.

4. The chip surface base device structure of claim 1, further comprising:
an information transfer circuit in the second superconducting material that is communicatively coupled to the transmon qubit.

5. The chip surface base device structure of claim 1, further comprising:
an information transfer circuit that electrically couples the transmon qubit to one or more other qubits and/or to input, output, or read circuitry; and
wherein the information transfer circuit is formed on the second superconducting material.

6. The chip surface base device structure of claim 2, wherein the information transfer circuit comprises a resonant bus; further comprising the transmon qubit is communicatively coupled to the resonant bus using a second capacitor.

7. The chip surface base device structure of claim 6, wherein the resonant bus is covered by the crystalline substrate.

8. A method, comprising:
physically coupling a first superconducting material to a crystalline substrate;
physically coupling the crystalline substrate to a second superconducting material, wherein the second superconducting material is physically coupled to a second crystalline substrate;
forming a vertical Josephson junction in a via of the crystalline substrate, the vertical Josephson junction comprising the first superconducting material, a tunnel barrier, and the second superconducting material; and
forming a transmon qubit comprising the vertical Josephson junction and a capacitor formed between the first superconducting material and the second superconducting material.

9. The method of claim 8, further comprising:
removing a portion of the crystalline substrate, such that an edge of the crystalline substrate is located within an edge of the second superconducting material.

10. The method of claim 8, further comprising:
removing a portion of the first superconducting material such that an edge of the first superconducting material is flush with the edge of the crystalline substrate.

11. The method of claim 8, further comprising:
removing a portion of the first superconducting material such that an edge of the first superconducting material is located within an edge of the crystalline substrate.

12. The method of claim 8, further comprising:
removing a portion of the first superconducting material such that an edge of the first superconducting material extends past an edge of the second superconducting material.

13. The method of claim 8, further comprising:
electrically coupling a resonator to a first side of the first superconducting material or the second superconducting material.

14. The method of claim 8, further comprising:
electrically coupling multiple resonators to multiple sides of a group consisting of the first superconducting material and the second superconducting material.

15. The method of claim 8, wherein a portion of the second superconducting material that is located outside of the vertical Josephson junction is exposed to air.

16. A chip surface base device structure, comprising:
a vertical Josephson junction that is formed in a via of a crystalline substrate, the vertical Josephson junction comprising a first superconducting material physically coupled to a tunnel barrier, the tunnel barrier being physically coupled to a second superconducting material; and
a transmon qubit comprising the vertical Josephson junction and a capacitor formed between the first superconducting material and the second superconducting material.

17. The chip surface base device structure of claim 16, further comprising:
a readout resonator that electrically couples to and addresses the transmon qubit of the chip surface base device structure.

18. The chip surface base device structure of claim 16, further comprising:
another superconducting qubit; and
a resonant bus that electrically couples the transmon qubit and the another superconducting qubit.

19. The chip surface base device structure of claim 16, further comprising:
a second transmon qubit formed from the first superconducting material and the crystalline substrate that is isolated from cross talk from the transmon qubit.

20. The chip surface base device structure of claim 19, further comprising:
a resonant bus that electrically couples the transmon qubit and the second transmon qubit.

21. A method, comprising:
forming a vertical Josephson junction in a via of a crystalline substrate, the vertical Josephson junction comprising a first superconducting material physically coupled to a tunnel barrier, the tunnel barrier being physically coupled to a second superconducting material; and forming a transmon qubit comprising the vertical Josephson junction and a capacitor formed between the first superconducting material and the second superconducting material.

22. The method of claim 21, further comprising:
covering a portion of the second superconducting material that is located outside of the vertical Josephson junction with the crystalline substrate.

23. The method of claim 21, further comprising:
forming the first superconducting material, such that an edge of the first superconducting material extends past an edge of the crystalline substrate.

24. The method of claim 21, further comprising:
a plurality of other superconducting qubits and a plurality of resonant busses, wherein each resonant bus electrically couples the transmon qubit to one or more of the plurality of other superconducting qubits to input, output or read circuitry.

25. A chip surface base device structure, comprising:
a vertical Josephson junction formed in a via of a silicon-on-metal (SOM) base, wherein the SOM is a superconductor; and
a transmon qubit comprising the vertical Josephson junction and a capacitor formed between a portion of the superconductor of the SOM and a second superconducting material.

* * * * *